US012598811B2

(12) United States Patent
Shin et al.

(10) Patent No.: US 12,598,811 B2
(45) Date of Patent: Apr. 7, 2026

(54) DISPLAY DEVICE

(71) Applicant: Samsung Display Co., LTD., Yongin-si (KR)

(72) Inventors: Dong Hee Shin, Yongin-si (KR); Gi Chang Lee, Yongin-si (KR); No Kyung Park, Yongin-si (KR); Sun Kwun Son, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 575 days.

(21) Appl. No.: 17/967,160

(22) Filed: Oct. 17, 2022

(65) Prior Publication Data

US 2023/0307461 A1     Sep. 28, 2023

(30) Foreign Application Priority Data

Mar. 24, 2022     (KR) ........................ 10-2022-0036882

(51) Int. Cl.
| | |
|---|---|
| *H10D 86/60* | (2025.01) |
| *H01L 25/16* | (2023.01) |
| *H10D 86/40* | (2025.01) |
| *H10H 20/857* | (2025.01) |
| *H10K 59/131* | (2023.01) |

(52) U.S. Cl.
CPC .......... *H10D 86/60* (2025.01); *H10D 86/441* (2025.01); *H10H 20/857* (2025.01); *H01L 25/167* (2013.01); *H10K 59/131* (2023.02)

(58) Field of Classification Search
CPC .... H10D 86/60; H10D 86/441; H10H 20/867; H10H 20/851; H10H 20/855; H10H 29/14; H01L 25/167; H01L 25/0753; H10K 59/131; H10K 59/35; H10K 59/38; G09G 2300/0426; G09G 2300/0452; G09G 2300/0804; G09G 2320/0295; G09G 3/325; G09G 3/3233
See application file for complete search history.

(56) References Cited

U.S. PATENT DOCUMENTS

| | | | |
|---|---|---|---|
| 9,082,362 B2 | 7/2015 | Bae et al. | |
| 10,068,520 B2 | 9/2018 | Xiang et al. | |
| 10,311,821 B2 * | 6/2019 | Fu ........................ | G09G 3/3607 |
| 10,971,105 B2 * | 4/2021 | Chen .................... | G09G 3/3688 |

(Continued)

FOREIGN PATENT DOCUMENTS

| | | |
|---|---|---|
| KR | 10-2016-0004855 A | 1/2016 |
| KR | 10-2017-0000883 A | 1/2017 |

(Continued)

*Primary Examiner* — Galina G Yushina
(74) *Attorney, Agent, or Firm* — Womble Bond Dickinson (US) LLP

(57) ABSTRACT

A display device includes data lines arranged in a first direction, the data lines extending in a second direction; and pixels including sub-pixels arranged in the first direction, the sub-pixels being electrically connected to the data lines. A distance between closest even data lines of the data lines is greater than a distance between adjacent sub-pixels of the sub-pixels, and each pixel includes first sub-pixels emitting light of a first color and second sub-pixels emitting light of a second color. Two first sub-pixels of two pixels adjacent to each other in the first direction are electrically connected to one even data line among the even data lines.

20 Claims, 19 Drawing Sheets

PXL_ODD: SPX1_0, SPX2_0, SPX3_0
PXL_EVEN: SPX1_E, SPX2_E, SPX3_E

(56)     References Cited

U.S. PATENT DOCUMENTS

| 11,600,680 | B2 | 3/2023 | Kim et al. | |
| 11,626,575 | B2 | 4/2023 | Baek et al. | |
| 11,848,335 | B2 * | 12/2023 | Oh | H01L 21/768 |
| 2011/0043500 | A1 * | 2/2011 | Kwak | G09G 3/3208 |
| | | | | 345/206 |
| 2014/0125647 | A1 * | 5/2014 | Shin | G09G 3/3648 |
| | | | | 345/212 |
| 2015/0168794 | A1 * | 6/2015 | Park | G09G 3/3659 |
| | | | | 349/48 |
| 2016/0334684 | A1 * | 11/2016 | Li | G02F 1/133514 |
| 2019/0131324 | A1 * | 5/2019 | Jiang | H10D 86/443 |
| 2021/0183283 | A1 | 6/2021 | Park et al. | |
| 2021/0358393 | A1 * | 11/2021 | Kang | H10H 20/01 |
| 2022/0077201 | A1 * | 3/2022 | Lee | H10D 86/60 |
| 2022/0209210 | A1 * | 6/2022 | Kim | H10K 71/00 |

FOREIGN PATENT DOCUMENTS

| KR | 10-1778650 | 9/2017 |
| KR | 10-2020-0074727 A | 6/2020 |
| KR | 10-2021-0074065 | 6/2021 |
| KR | 10-2332275 | 12/2021 |
| KR | 10-2022-0016425 A | 2/2022 |

* cited by examiner

LD: LD1, LD2

PXL_ODD: SPX1_O, SPX2_O, SPX3_O
PXL_EVEN: SPX1_E, SPX2_E, SPX3_E

SPX1_0

DR1

DR2

LD: LD1, LD2

LD: LD1, LD2

LD: LD1, LD2

PXL_ODD_1: SPX1_O_1, SPX2_O_1, SPX3_O_1
PXL_EVEN_1: SPX1_E_1, SPX2_E_1, SPX3_E_1

DISPLAY DEVICE

CROSS-REFERENCE TO RELATED APPLICATION

This application claims priority to and benefits of Korean patent application No. 10-2022-0036882 under 35 U.S.C. § 119(a), filed on Mar. 24, 2022, in the Korean Intellectual Property Office (KIPO), the entire contents of which are incorporated herein by reference.

BACKGROUND

1. Technical Field

The disclosure generally relates to a display device.

2. Description of the Related Art

As interest in information displays and demand for portable information media increase, research and commercialization has focused on display devices.

SUMMARY

Embodiments provide a display device in which a load of a signal line is decreased.

In accordance with an aspect of the disclosure, there is provided a display device including data lines arranged in a first direction, the data lines extending in a second direction; and pixels including sub-pixels arranged in the first direction, the sub-pixels being electrically connected to the data lines, wherein a distance between closest even data lines of the data lines is greater than a distance between adjacent sub-pixels of the sub-pixels. Each pixel includes first sub-pixels emitting light of a first color and second sub-pixels emitting light of a second color. Two first sub-pixels of two pixels adjacent to each other in the first direction are electrically connected to one even data line among the even data lines.

Two second sub-pixels adjacent to each other in the first direction among the second sub-pixels may be electrically connected to another data line among the data lines.

The data lines may be spaced apart from each other with two of the sub-pixels being disposed between the data lines.

The sub-pixels may further include third sub-pixels emitting light of a third color. The one data line electrically connected to the two first sub-pixels may be located between a second sub-pixel among the second sub-pixels and a third sub-pixel among the third sub-pixels which are adjacent to each other.

Two third sub-pixels adjacent to each other among the third sub-pixels may be electrically connected to another data line among the data lines. The another data line may be located between a first sub-pixel among the first sub-pixels and a second sub-pixel among the second sub-pixels which are adjacent to each other.

The display device may further include sensing lines arranged in the first direction, the sensing lines extending in the second direction. Two sub-pixels adjacent to each other among the sub-pixels may be electrically connected to one sensing line among the sensing lines.

A distance between the sensing lines may be substantially equal to the distance between the data lines.

The data lines and the sensing lines may be alternately arranged in the first direction with one of the sub-pixels being disposed between the data lines and the sensing lines.

The two first sub-pixels may be electrically connected to different sensing lines among the sensing lines.

Each of the sensing lines may be electrically connected to two sub-pixels most adjacent to each of the sensing lines among the sub-pixels. The two sub-pixels may emit lights of different colors.

Each of the sub-pixels may include a pixel circuit including at least one transistor; and at least one light emitting element electrically connected to the pixel circuit. The two first sub-pixels may have circuit structures reversed to each other in the second direction in a plan view.

The at least one light emitting element may include inorganic light emitting diodes electrically connected in parallel to each other.

The at least one light emitting element may include an organic light emitting diode.

Each of the sub-pixels may include at least one light emitting element disposed on a substrate; a wavelength conversion pattern disposed above the at least one light emitting element, the wavelength conversion pattern emitting light by converting a wavelength band of light incident from the at least one light emitting element; and a color filter disposed above the wavelength conversion pattern.

In accordance with another aspect of the disclosure, there is provided a display device including a first data line, a second data line, and a third data line arranged in a first direction and extending in a second direction; a first scan line and a second scan line extending in the first direction; and a first pixel and a second pixel electrically connected to the first and second scan lines and adjacent to each other in one pixel row. Each of the first pixel and the second pixel includes a first sub-pixel, a second sub-pixel, and a third sub-pixel, which are sequentially arranged in the first direction. The first sub-pixel of the first pixel and the first sub-pixel of the second pixel share the first data line, and the third sub-pixel of the first pixel and the third sub-pixel of the second pixel share the second data line.

The second sub-pixel of the second pixel may be electrically connected to the third data line, and the second sub-pixel of the first pixel may be electrically connected to a reference data line different from the third data line.

The first data line may be located between the second sub-pixel and the third sub-pixel of the first pixel, and the second data line may be located between the first sub-pixel and the second sub-pixel of the second pixel.

The display device may further include sensing lines arranged in the first direction, the sensing lines extending in the second direction. Each of the sensing lines may be electrically connected to two sub-pixels most adjacent thereto among the first, second, and third sub-pixels.

The sensing lines may include a first sensing line, a second sensing line, and a third sensing line.

The first sub-pixel and the second sub-pixel of the first pixel may share the first sensing line. The third sub-pixel of the first pixel and the first sub-pixel of the second pixel may share the second sensing line.

Each of the first, second, and third sub-pixels may include a pixel circuit including at least one transistor; and at least one light emitting element electrically connected to the pixel circuit. The at least one light emitting element may include inorganic light emitting diodes electrically connected in parallel to each other.

BRIEF DESCRIPTION OF THE DRAWINGS

Example embodiments will now be described more fully hereinafter with reference to the accompanying drawings;

however, they may be embodied in different forms and should not be construed as limited to the embodiments set forth herein. Rather, these embodiments are provided so that this disclosure will be more thorough and complete, and will more fully convey the scope of the example embodiments to those skilled in the art.

Figure 1:
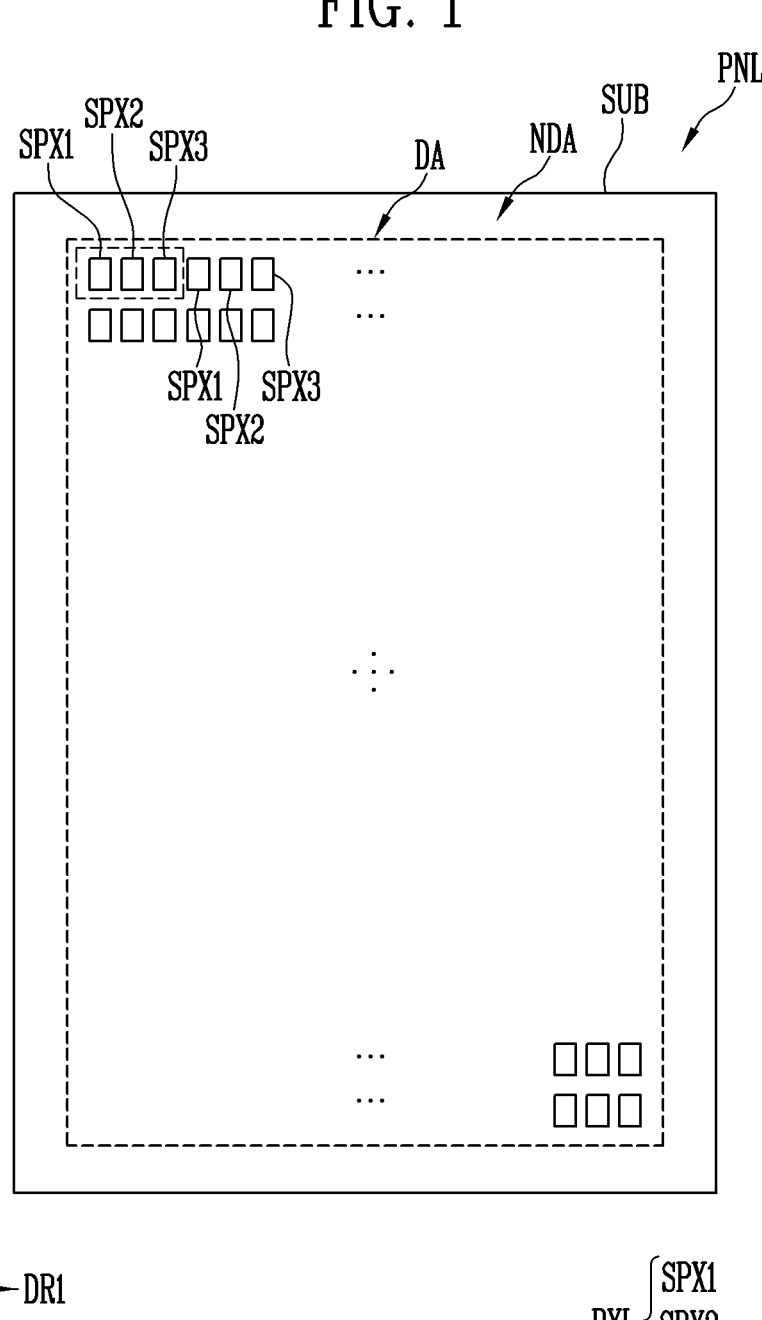
Figure 1:
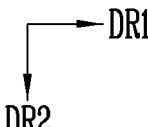

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 1 is a schematic plan view illustrating a display device in accordance with embodiments of the disclosure.

Figure 2A:
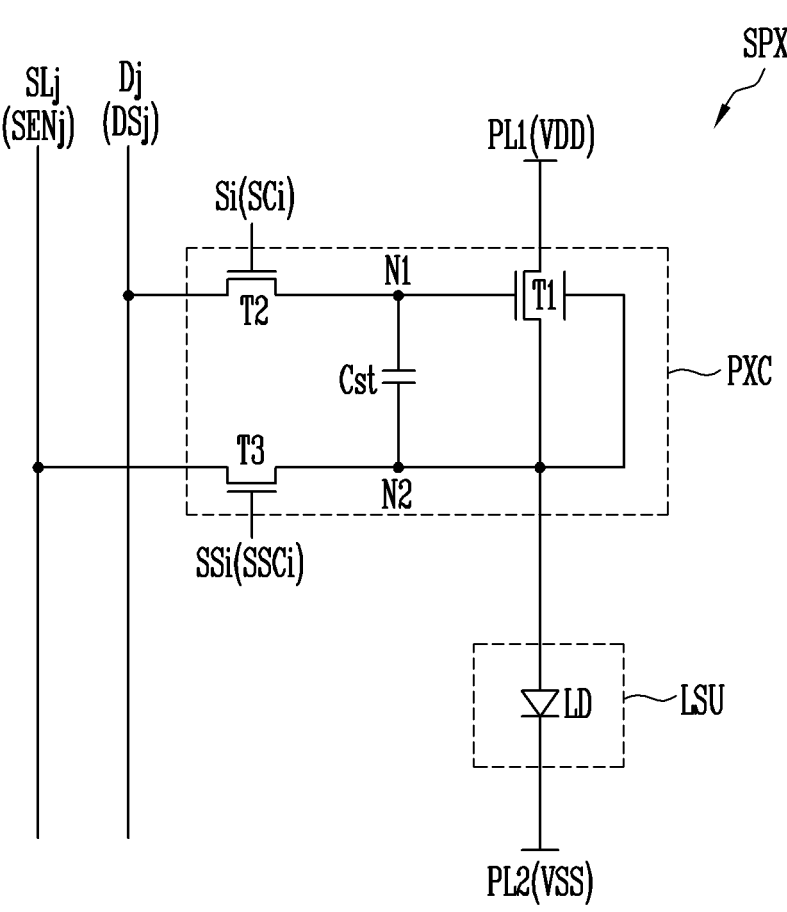
Figure 2B:
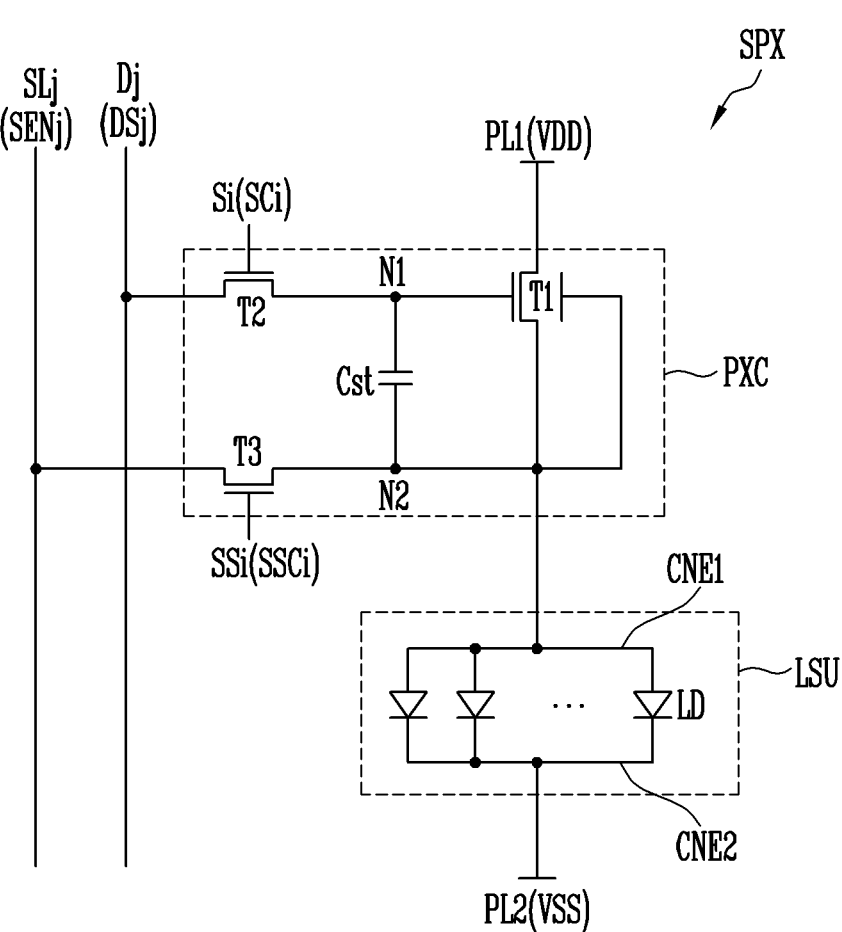
Figure 2C:
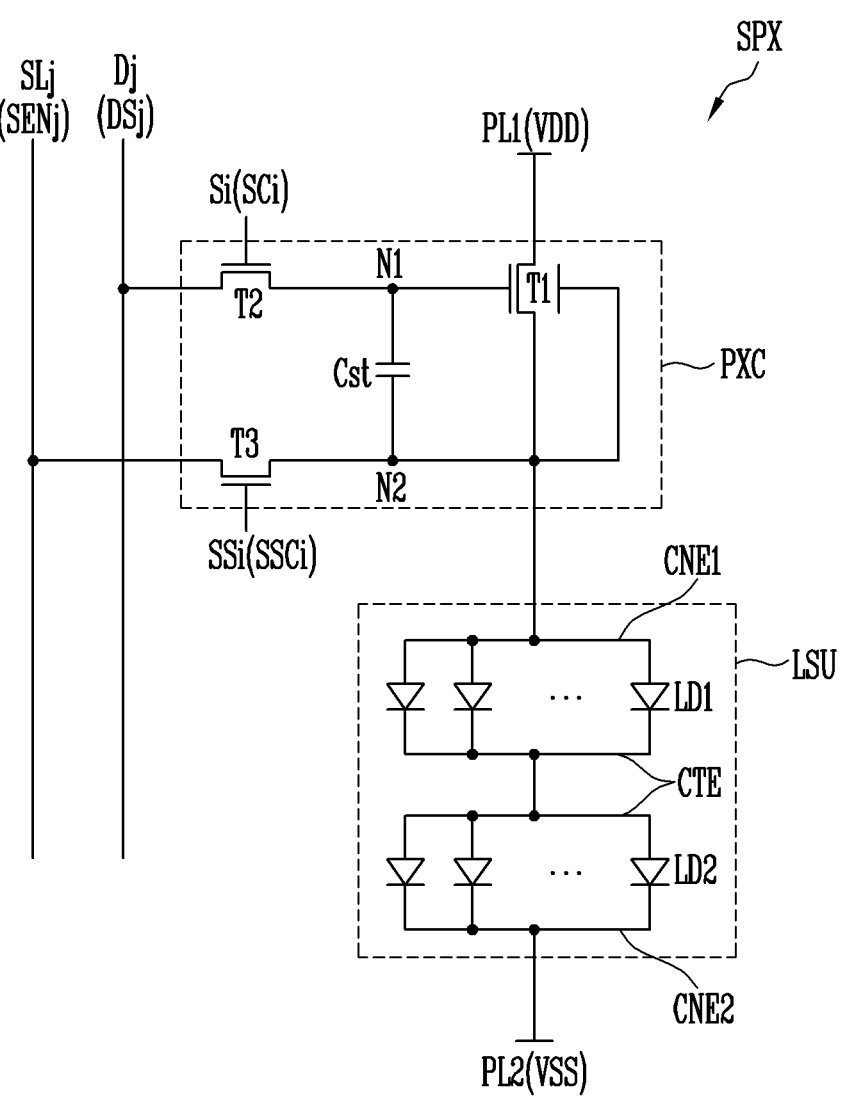

FIGS. 2A, 2B, and 2C are schematic diagrams of equivalent sub-pixel circuits illustrating an embodiment of a sub-pixel included in the display device shown in FIG. 1.

Figure 3:
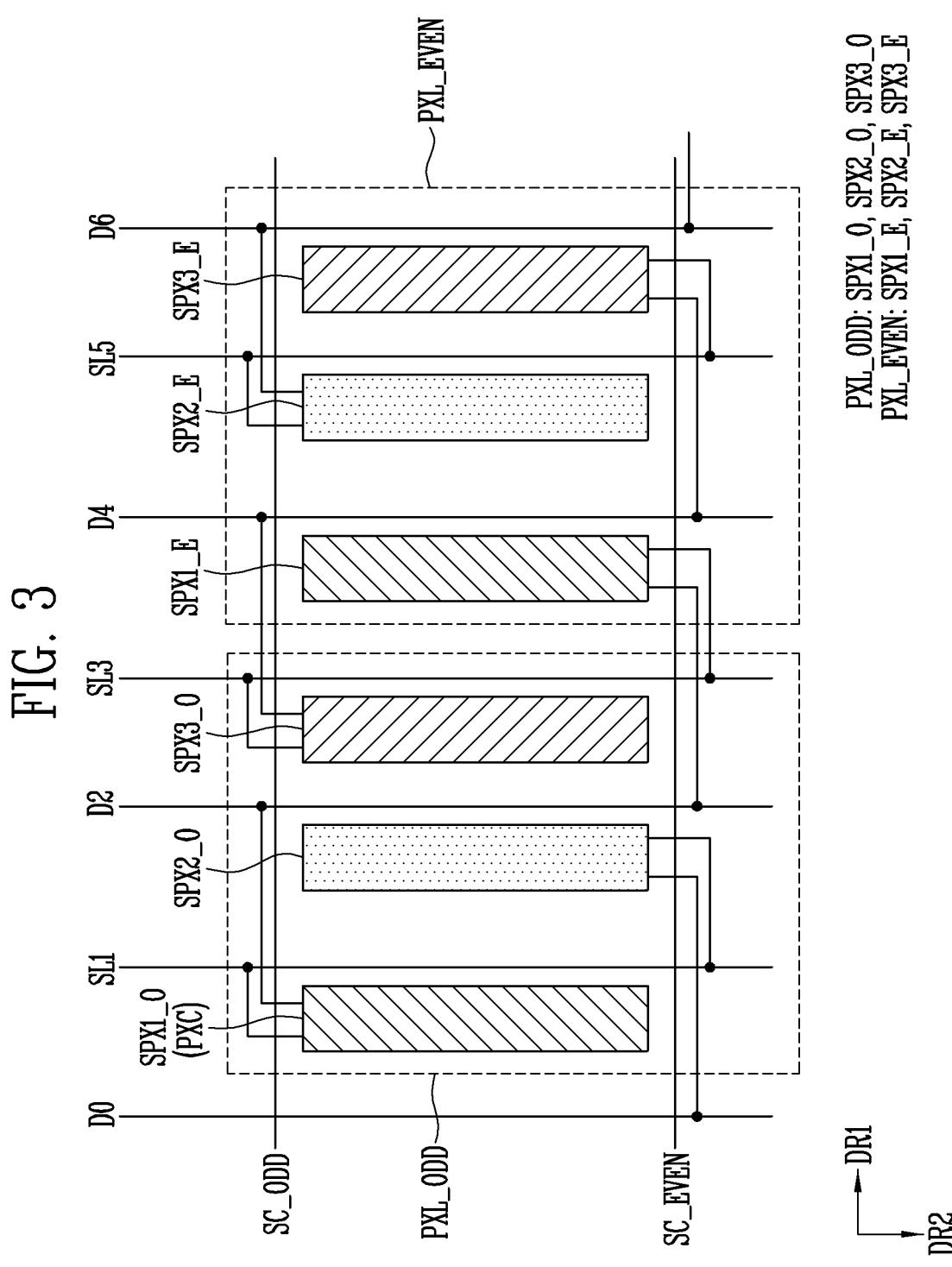

FIG. 3 is a schematic diagram of an equivalent circuit illustrating an embodiment of pixels included in the display device shown in FIG. 1.

Figure 4:
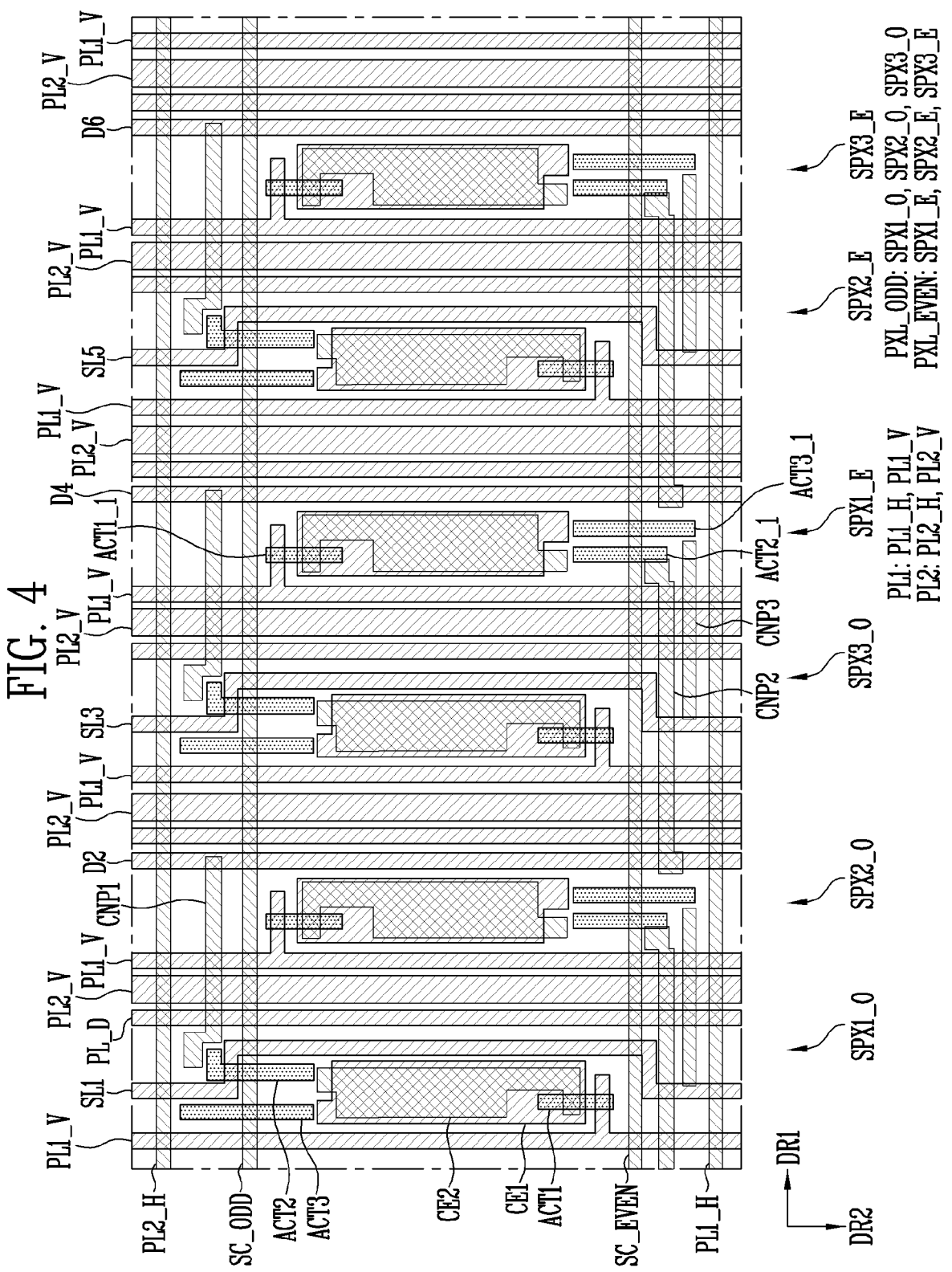
Figure 5:
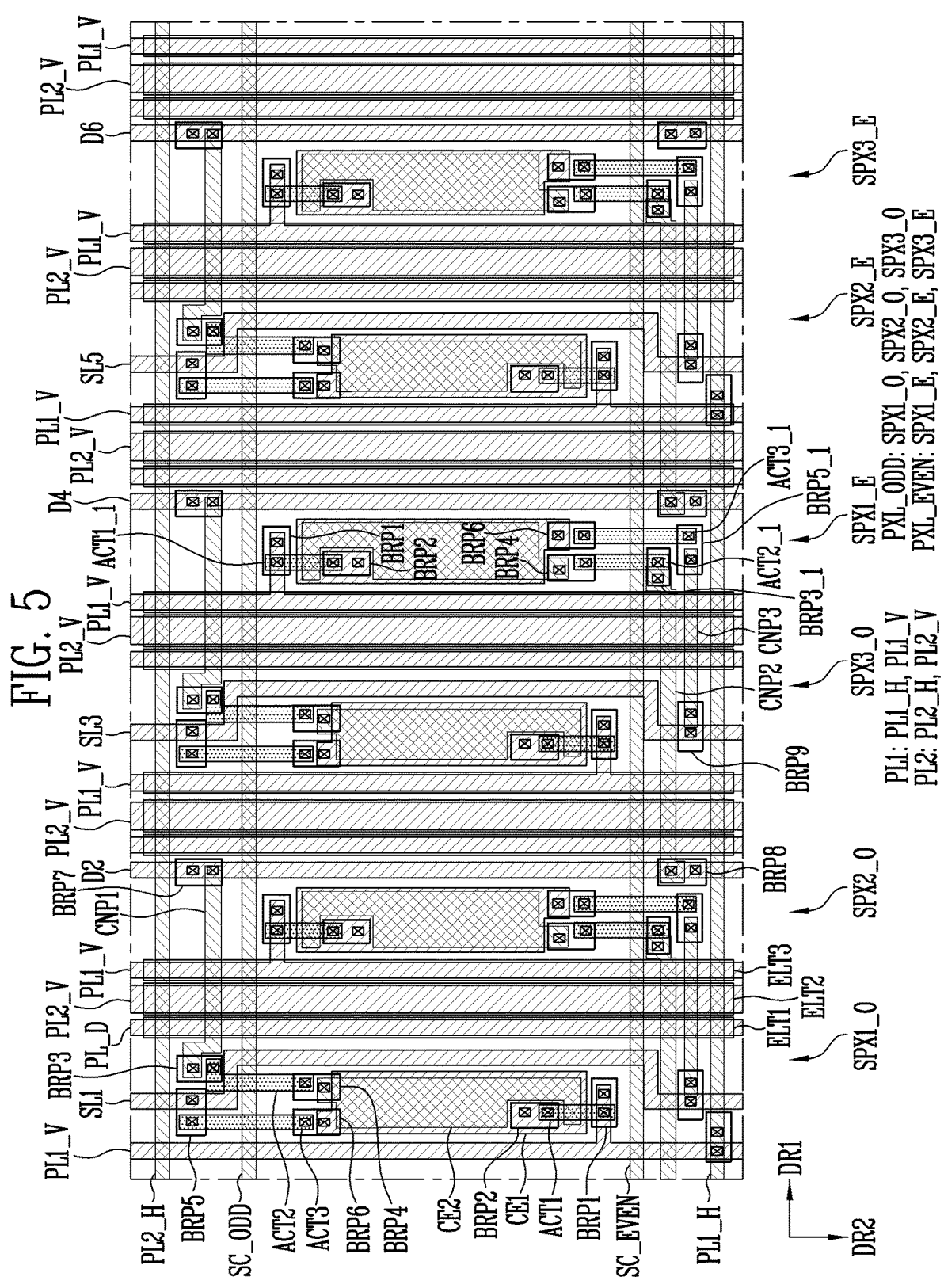

FIGS. 4 and 5 are schematic layout views illustrating the sub-pixels shown in FIG. 3.

Figure 6:
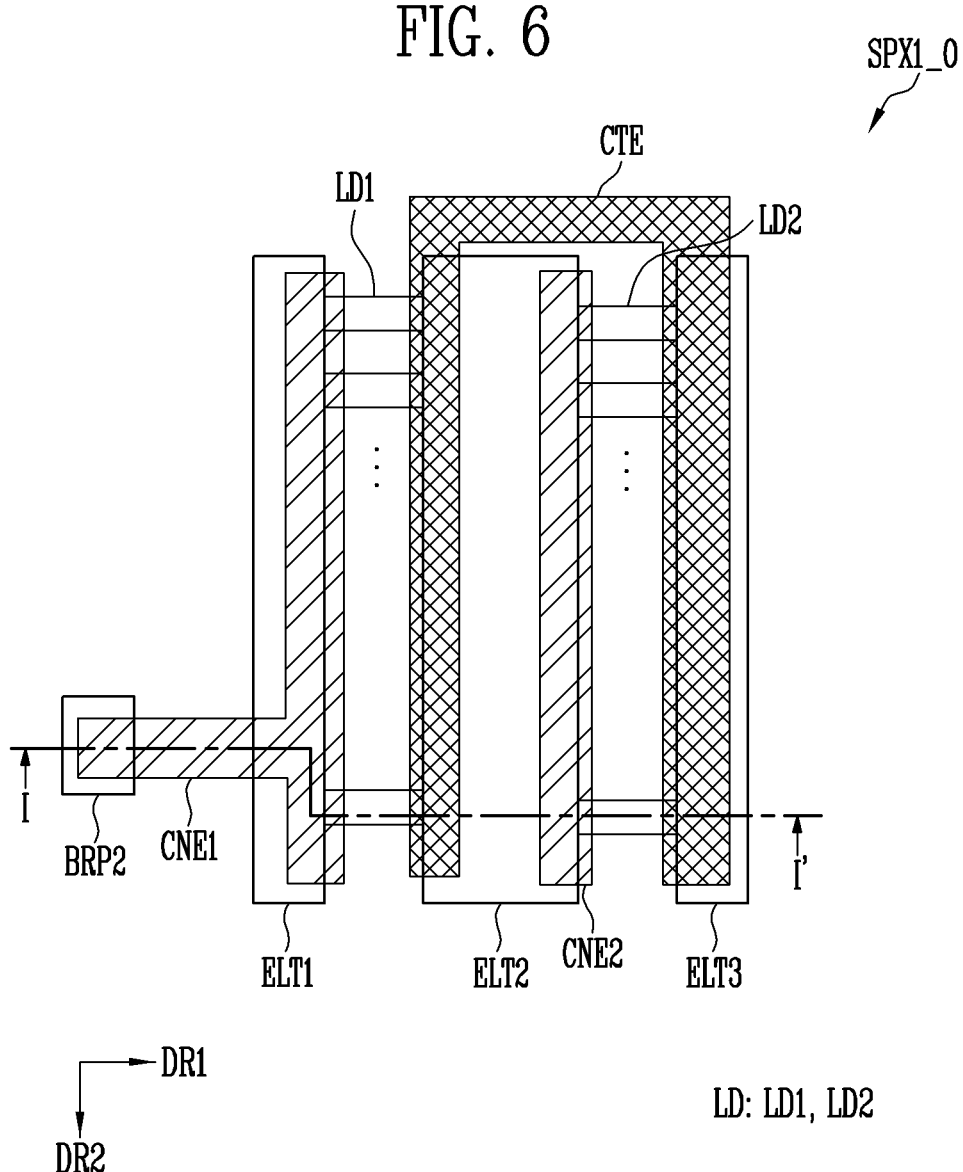

FIG. 6 is a schematic view illustrating an embodiment of a first sub-pixel shown in FIG. 5.

Figure 7:
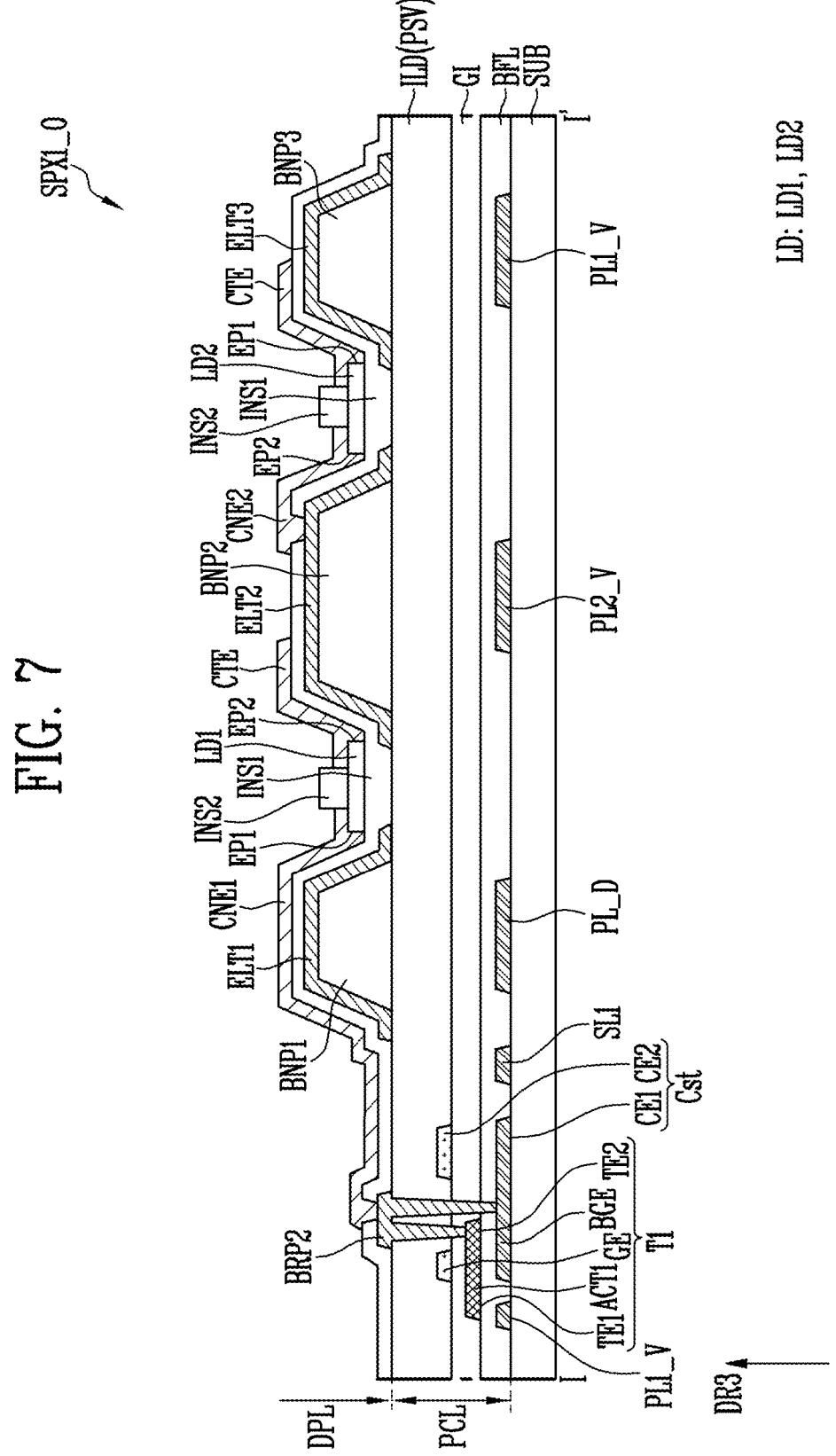

FIG. 7 is a schematic cross-sectional view illustrating an embodiment of the first sub-pixel taken along line I-I' shown in FIG. 6.

Figure 8A:
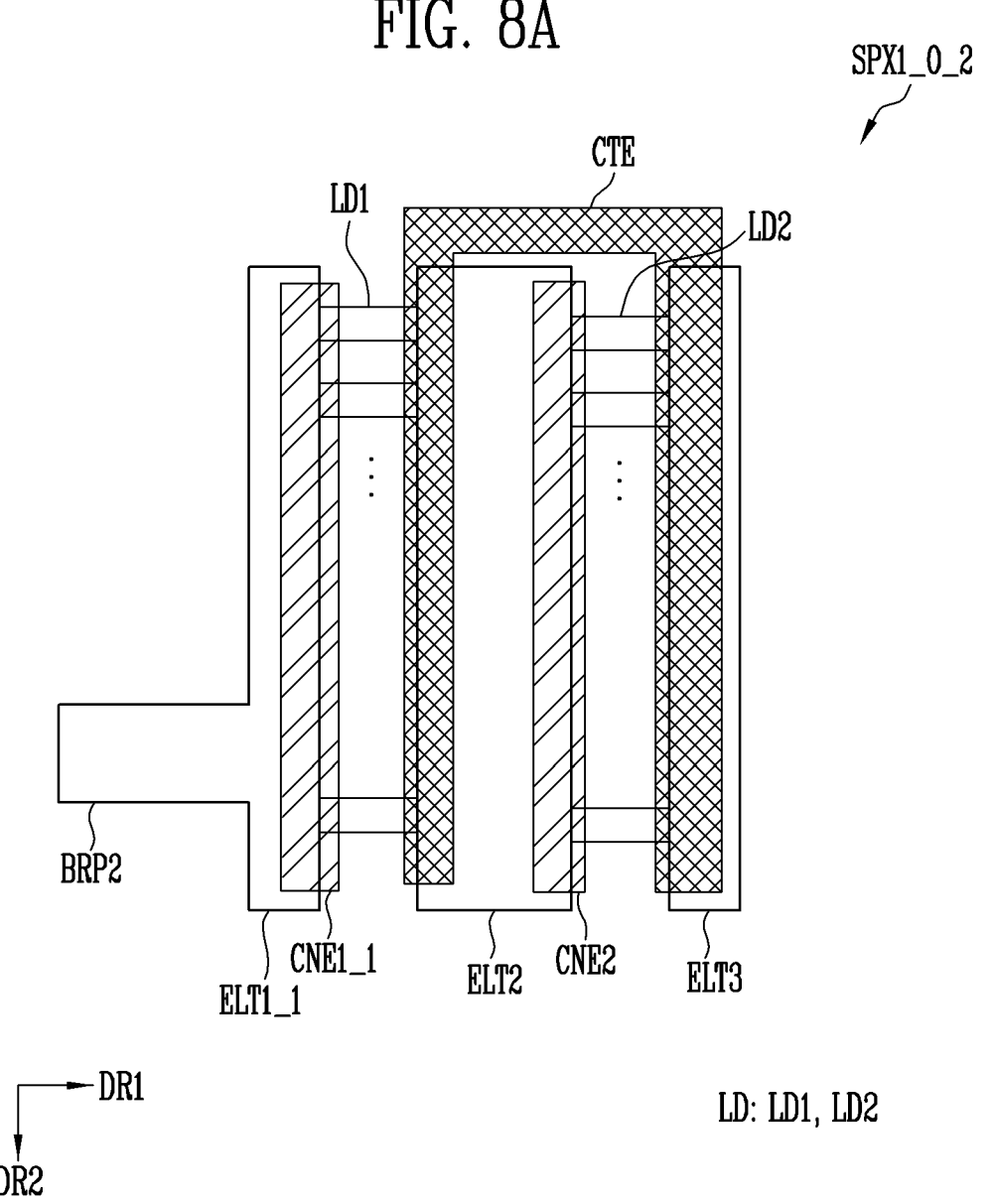
Figure 8B:
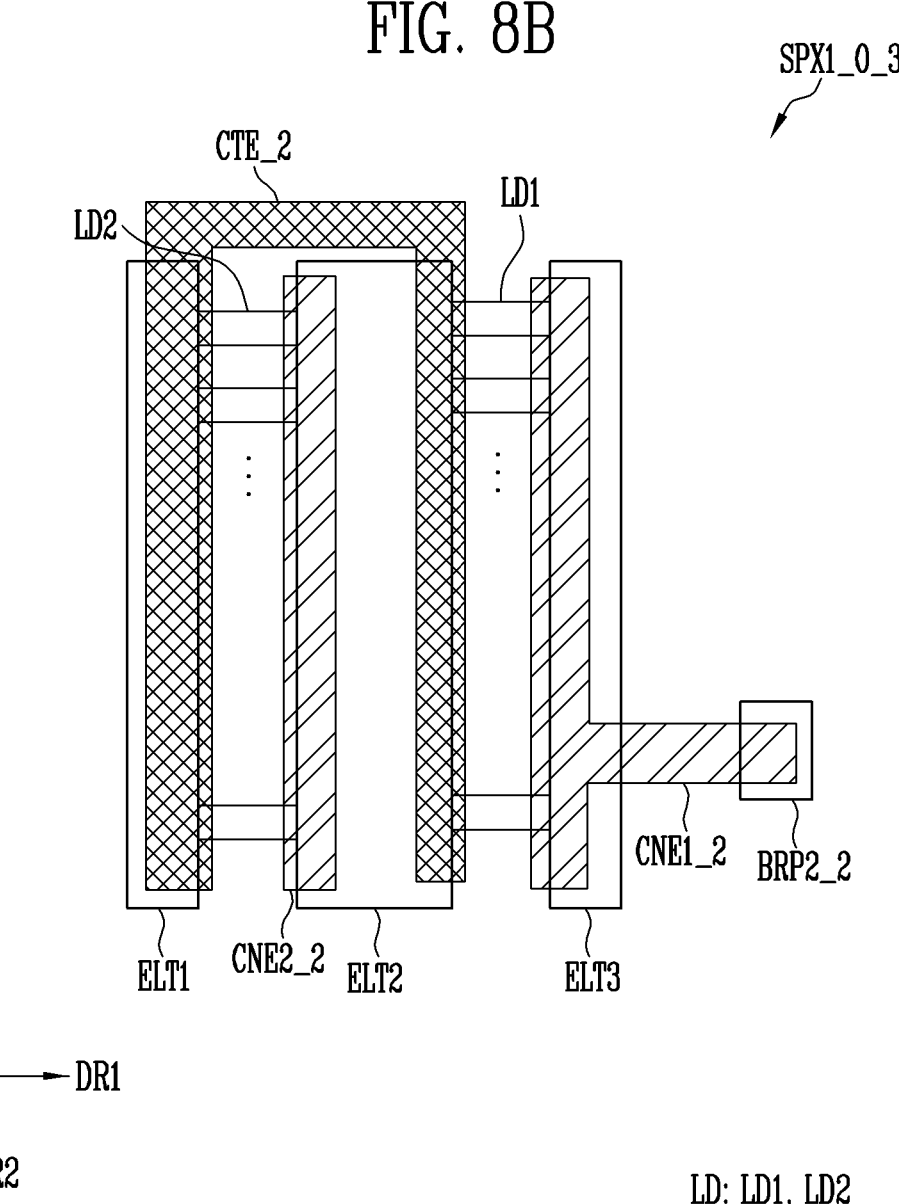

FIGS. 8A and 8B are schematic views illustrating another embodiment of the first sub-pixel shown in FIG. 5.

Figure 9A:
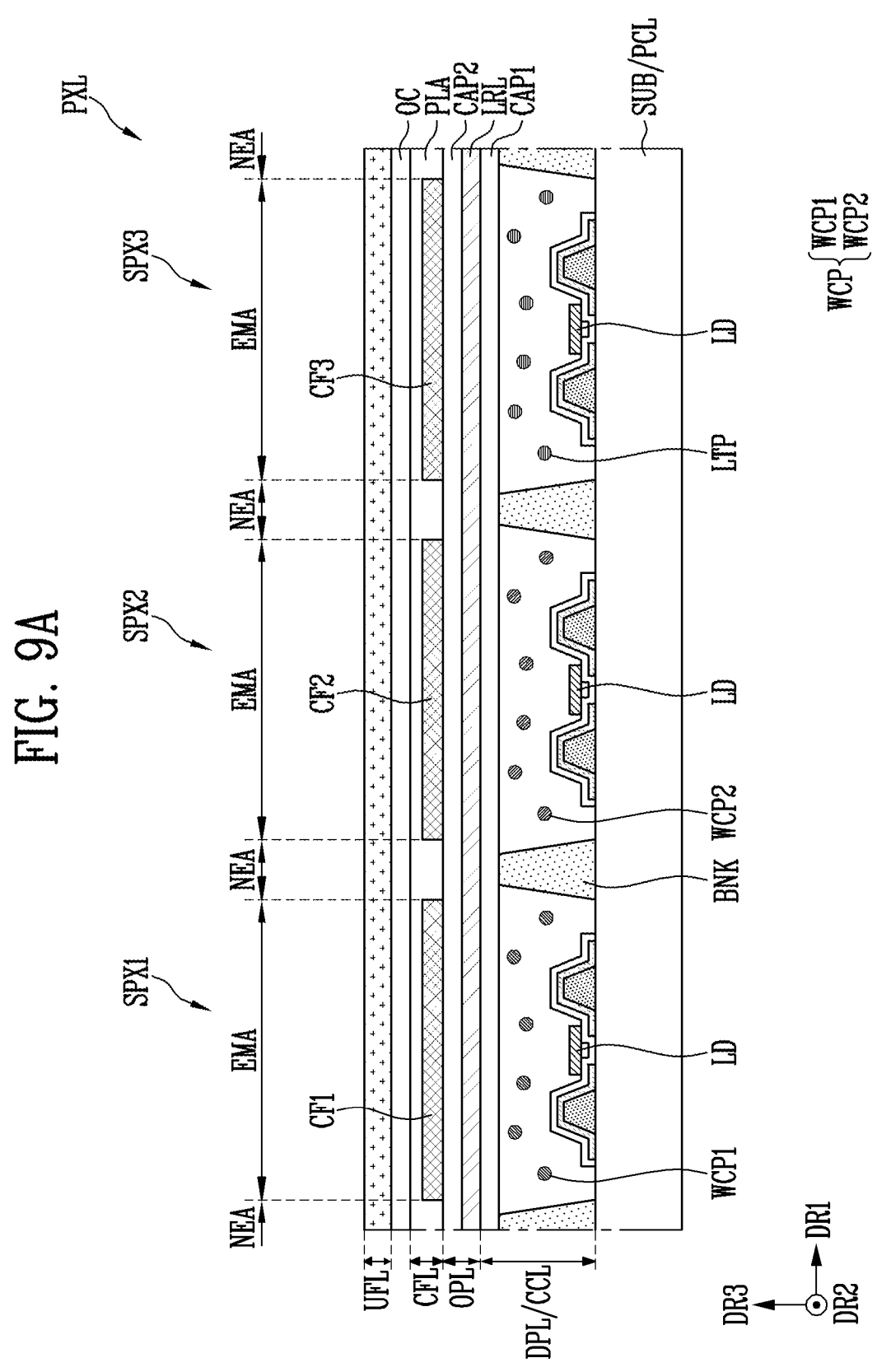
Figure 9B:
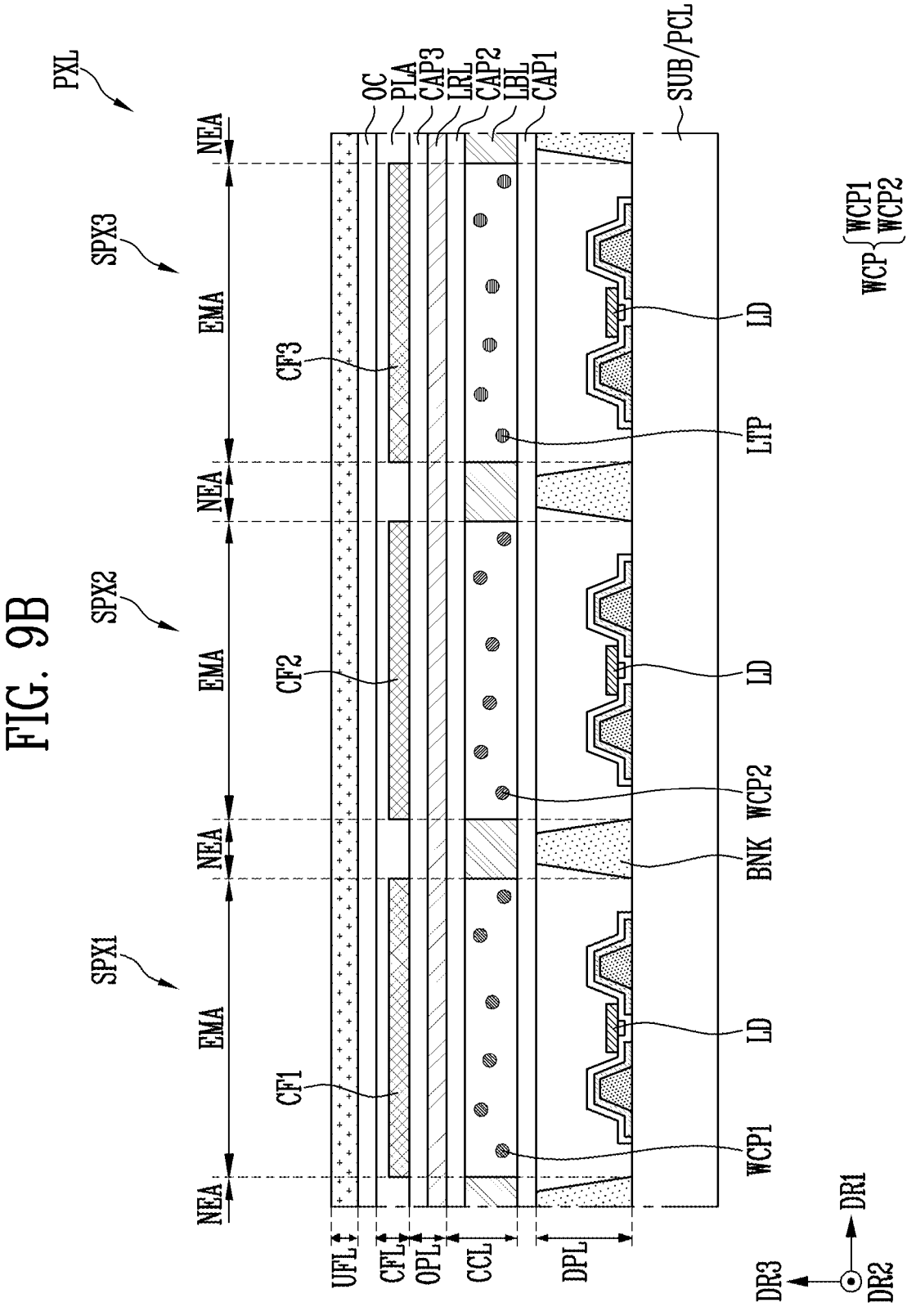

FIGS. 9A and 9B are cross-sectional views illustrating a pixel included in the display device shown in FIG. 1.

Figure 10:
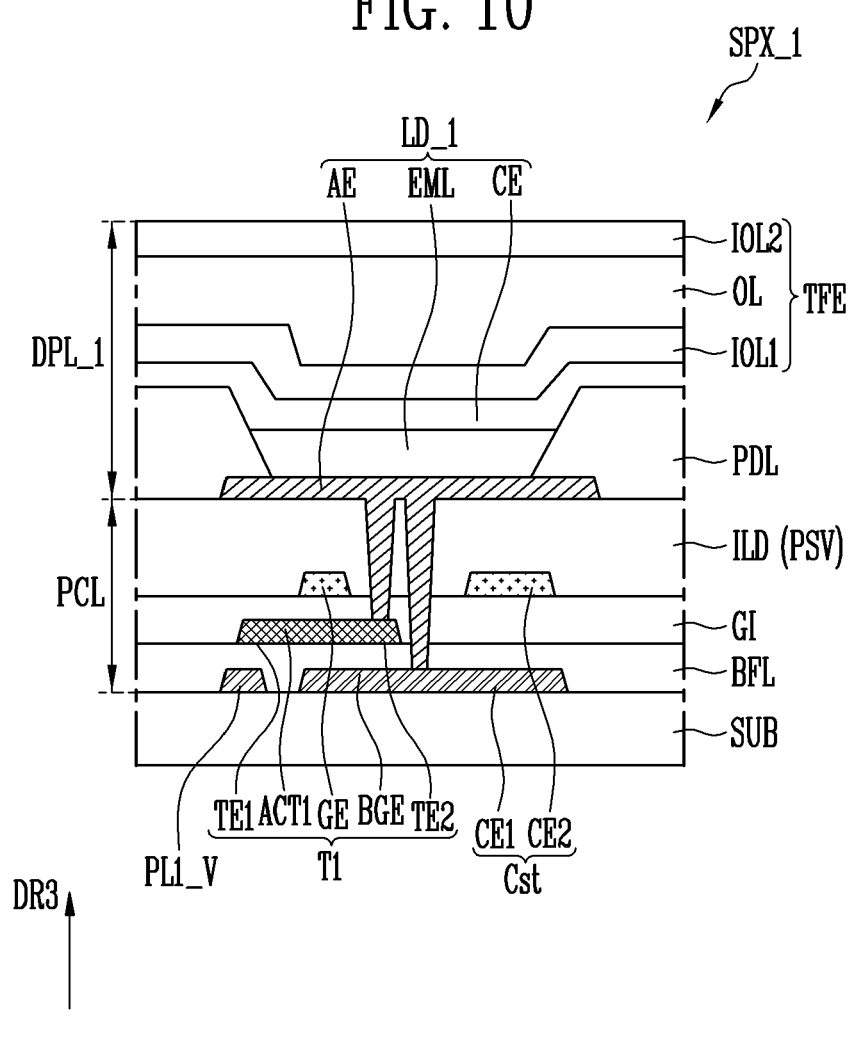

FIG. 10 is a cross-sectional view illustrating another embodiment of the sub-pixel included in the display device shown in FIG. 1.

Figure 11:
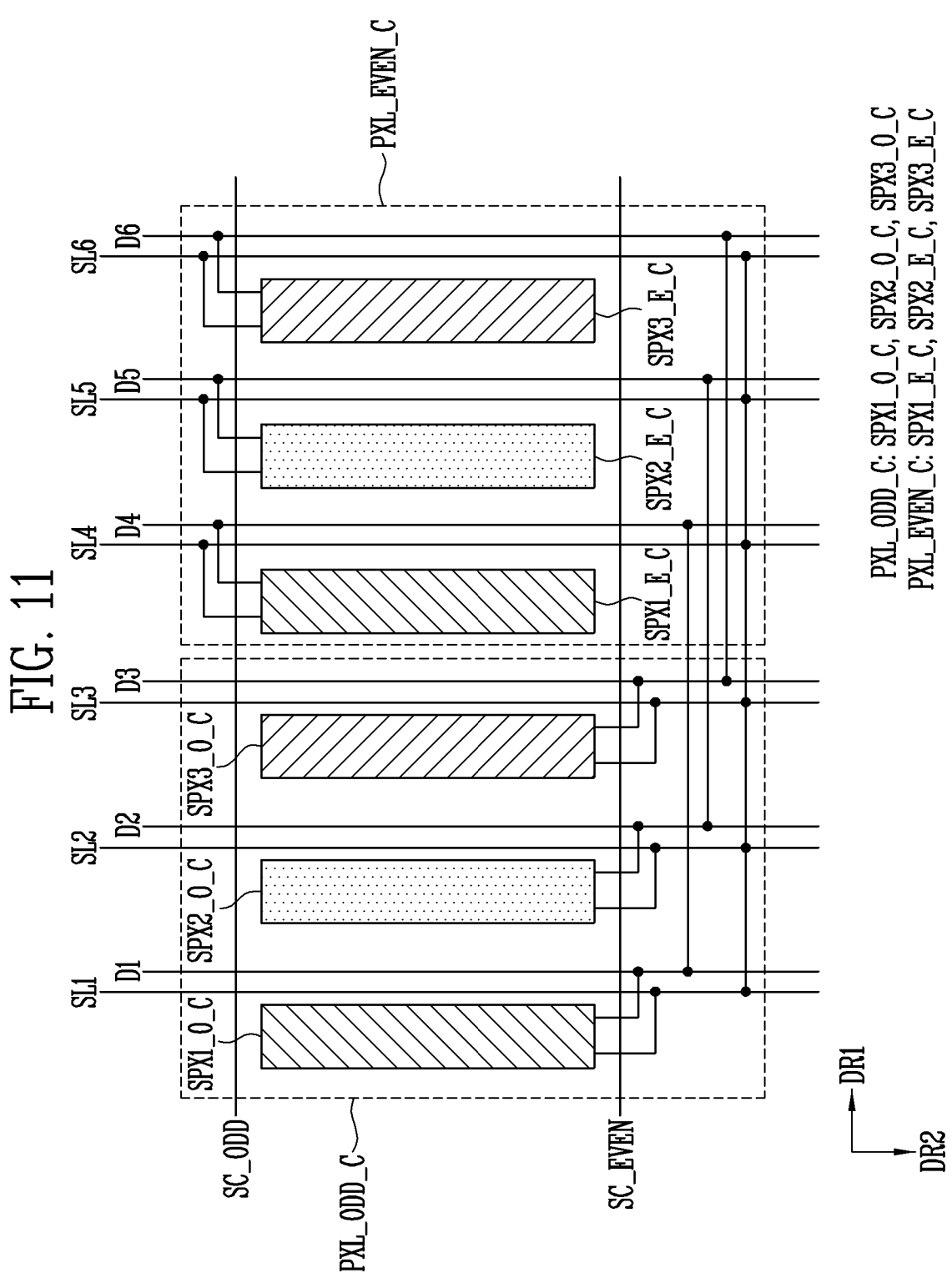

FIG. 11 is a schematic diagram of an equivalent circuit illustrating a comparative embodiment of the sub-pixels included in the display device shown in FIG. 1.

Figure 12:
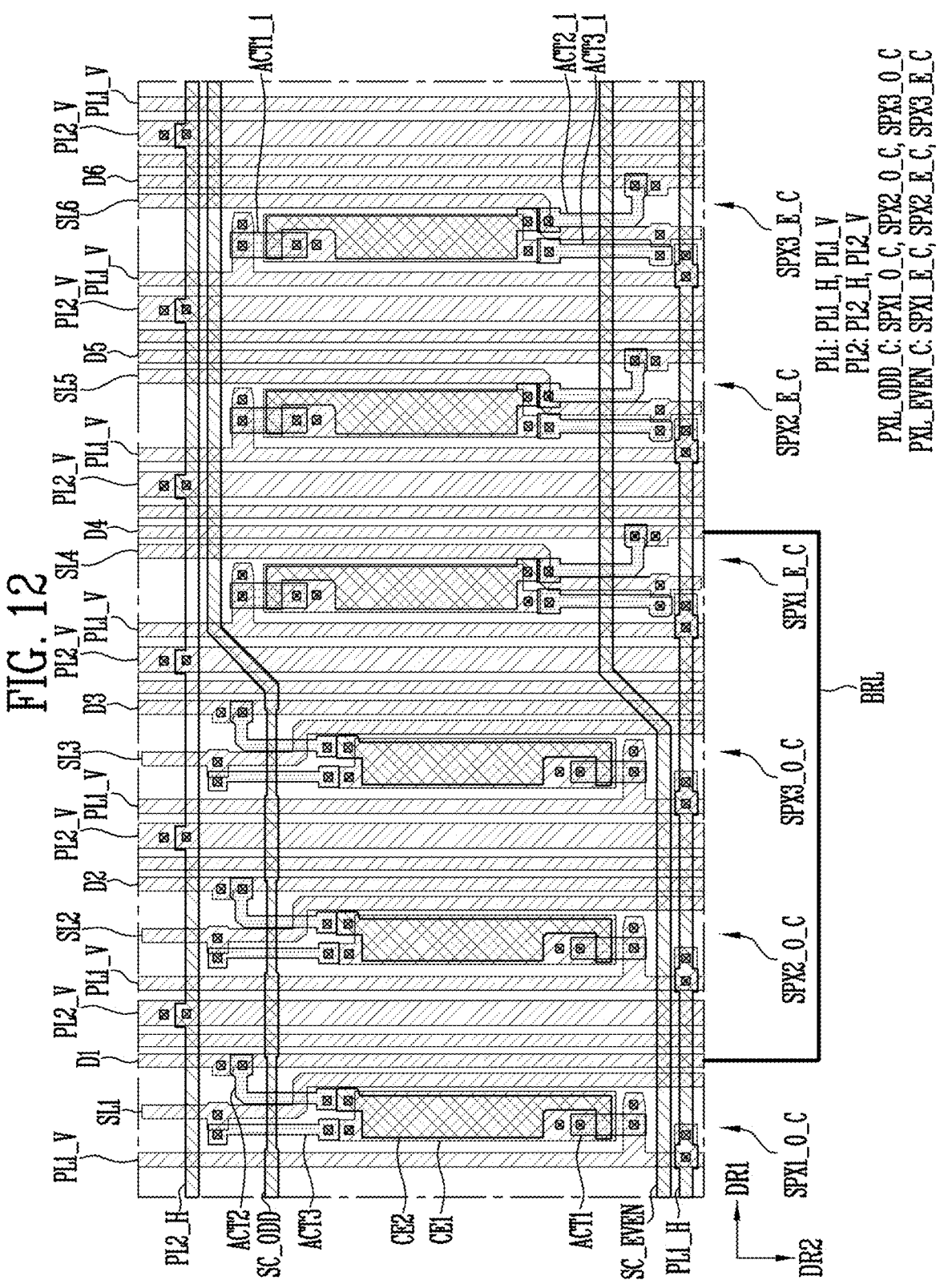

FIG. 12 is a schematic layout view illustrating the sub-pixels shown in FIG. 11.

Figure 13:
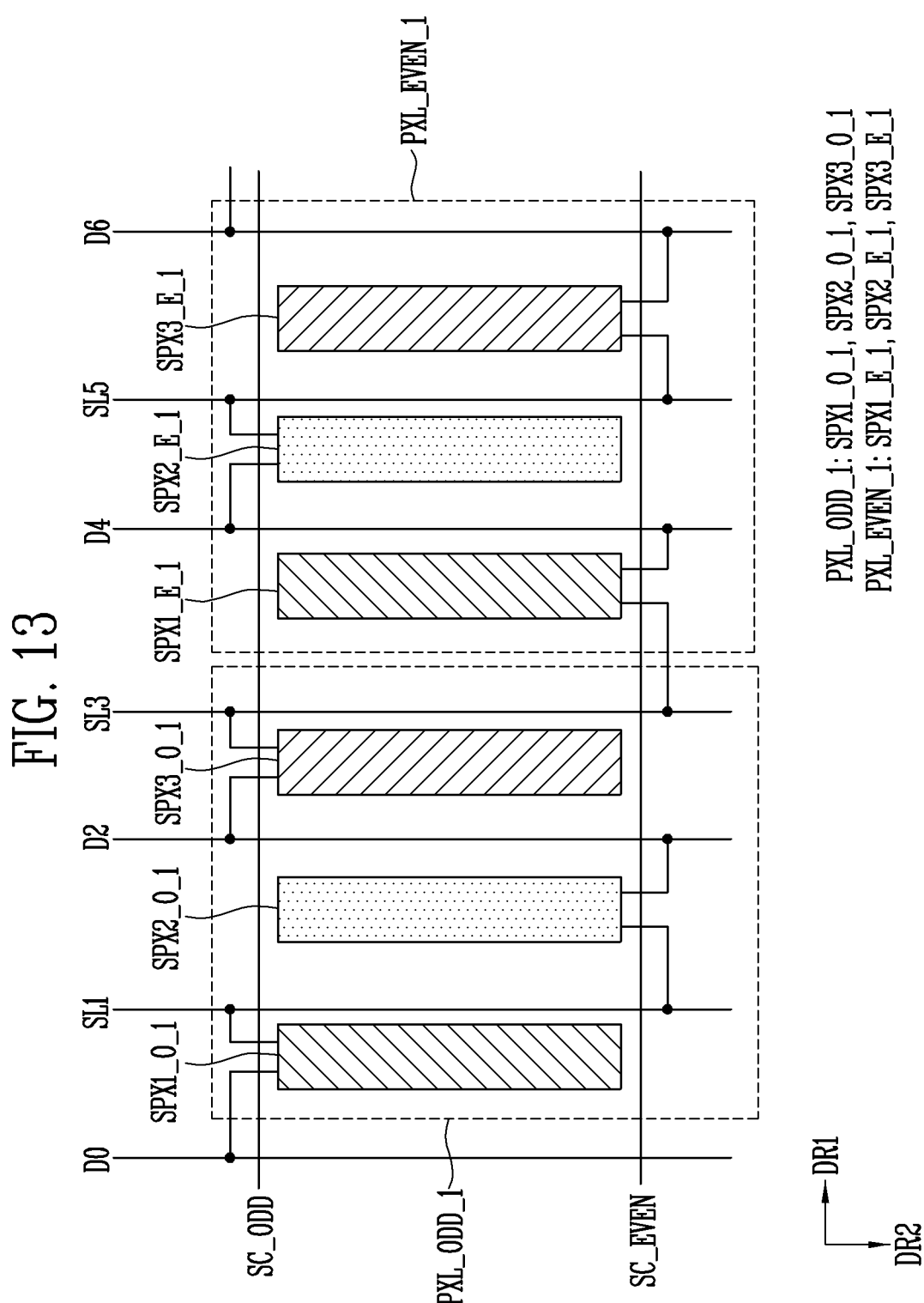

FIG. 13 is a schematic diagram of an equivalent circuit illustrating another embodiment of the sub-pixels included in the display device shown in FIG. 1.

Figure 14:
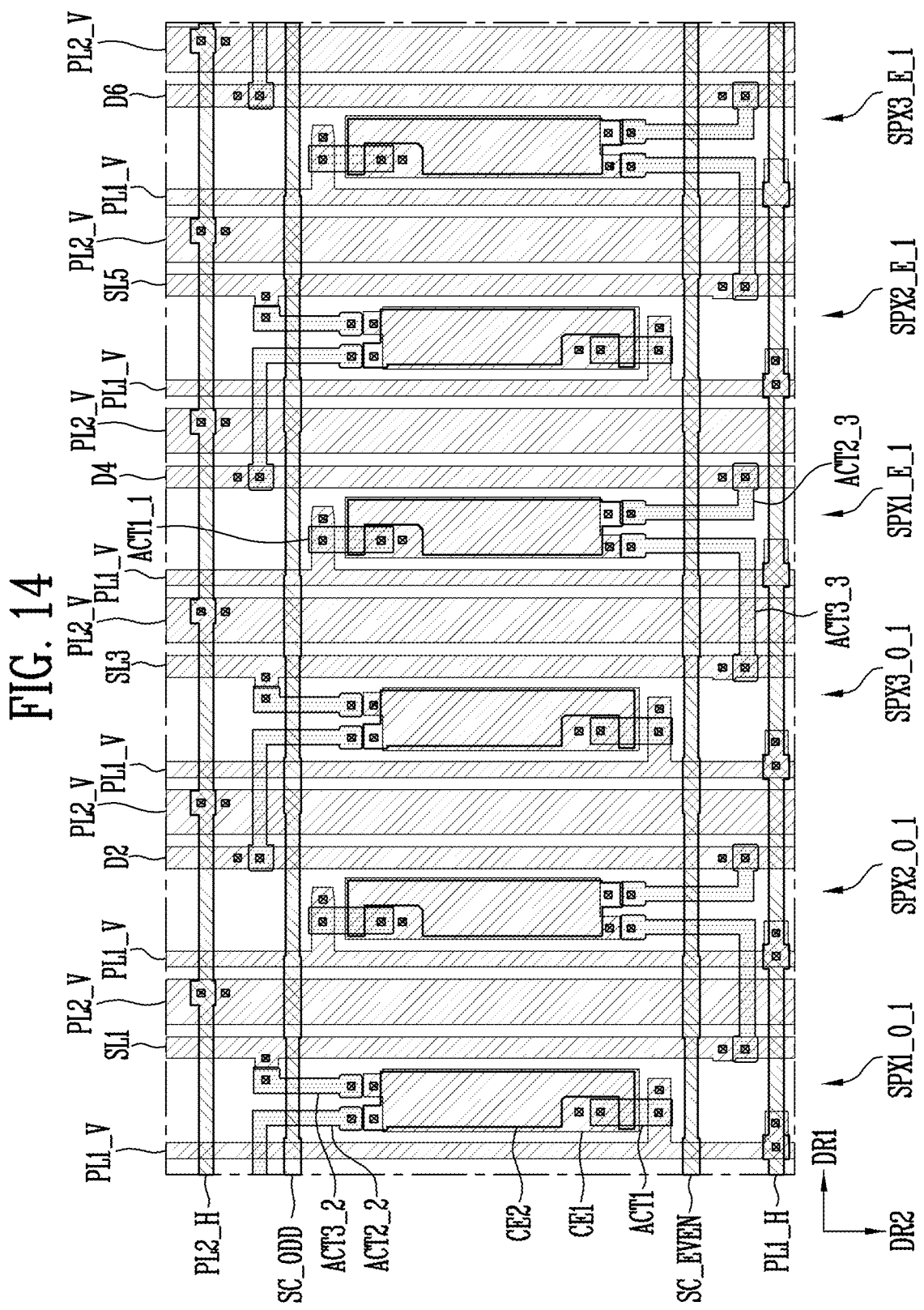

FIG. 14 is a schematic layout view illustrating the sub-pixels shown in FIG. 13.

Figure 15:
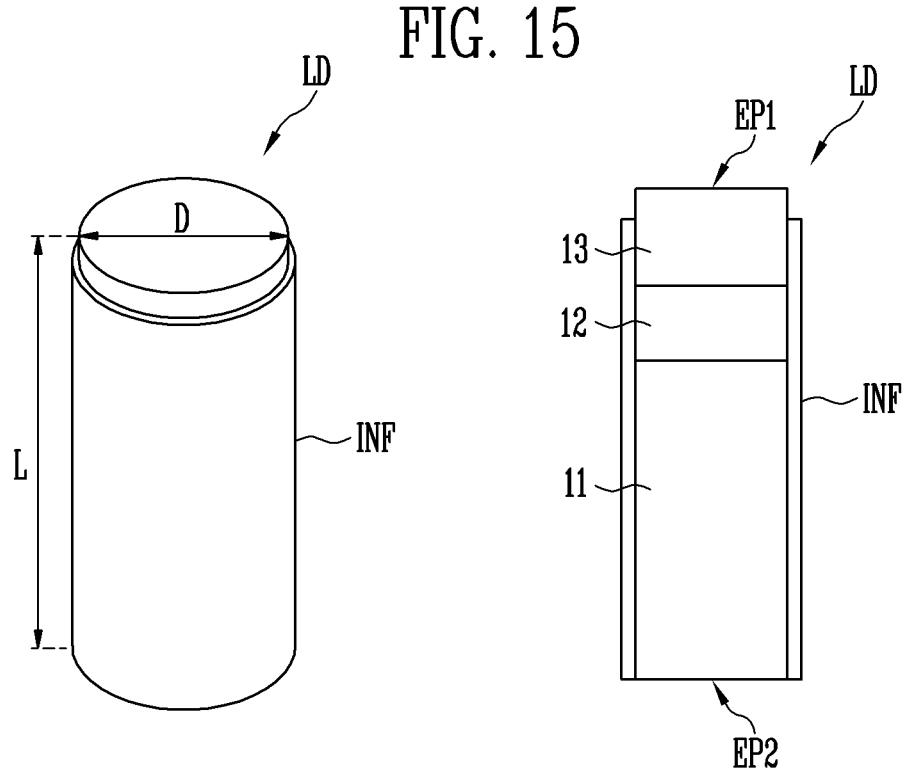

FIG. 15 is a schematic view illustrating a light emitting element in accordance with an embodiment of the disclosure.

DETAILED DESCRIPTION OF THE EMBODIMENTS

The disclosure may apply various changes and different shape, therefore only illustrate in detail with particular examples. However, the examples do not limit to certain shapes but apply to all the change and equivalent material and replacement. The drawings included are illustrated in a fashion where the figures may be expanded for the better understanding.

It will be understood that, although the terms "first," "second," and the like may be used herein to describe various elements, these elements should not be limited by these terms. These terms are only used to distinguish one element from another element. Thus, a "first" element discussed below could also be termed a "second" element without departing from the teachings of the disclosure. As used herein, the singular forms are intended to include the plural forms as well, unless the context clearly indicates otherwise.

It will be further understood that the terms "includes" and/or "including," when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

The effects and characteristics of the disclosure and a method of achieving the effects and characteristics will be clearly described by referring to the embodiments described below in detail together with the accompanying drawings. However, the disclosure is not limited to the embodiments disclosed herein but may be implemented in various forms. In the entire specification, when an element is referred to as being "connected" or "coupled" to another element, it can be directly connected or coupled to the another element or be indirectly connected or coupled to the another element with one or more intervening elements interposed therebetween. In an embodiment of the disclosure, the term "connection" between two components may include both electrical connection and physical connection. It will be understood that the terms "contact," "connected to," and "coupled to" may include a physical and/or electrical contact, connection, or coupling.

Spatially relative terms, such as "beneath," "below," "under," "lower," "on," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The term "and/or" includes all combinations of one or more of which associated configurations may define. For example, "A and/or B" may be understood to mean "A, B, or A and B."

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, a display device in accordance with an embodiment of the disclosure will be described with reference to the accompanying drawings.

FIG. 1 is a schematic plan view illustrating a display device in accordance with embodiments of the disclosure. FIG. 1 illustrates a display panel PNL provided in the display device.

FIG. 1 illustrates a structure of the display panel PNL based on a display area DA. However, in some embodiments, at least one driving circuit (e.g., at least one of a scan driver and a data driver), lines, and/or pads, which are not shown in the drawing, may be further disposed in the display panel PNL.

Referring to FIG. 1, the display panel PNL may include a substrate SUB and pixels PXL disposed on the substrate SUB.

The substrate SUB is used to constitute a base member of the display panel PNL, and may be a rigid or flexible substrate or film. In an example, the substrate SUB may be formed as (or configured as) a rigid substrate made of glass or tempered glass, a flexible substrate (or thin film) made of plastic or metal, or at least one insulating layer. The material and/or property of the substrate SUB is not particularly limited.

In an embodiment, the substrate SUB may be substantially transparent. The term "substantially transparent" may mean that light can be transmitted with a transmittance (e.g., a predetermined or selectable transmittance) or more. In another embodiment, the substrate SUB may be translucent or opaque. The substrate SUB may include a reflective material in some embodiments.

The display panel PNL and the substrate SUB for forming the same may include the display area DA for displaying an image and a non-display area NDA except the display area DA.

The pixels PXL may be arranged in the display area DA. Various lines, pads, and/or a built-in circuit, which are connected to the pixels PXL of the display area DA, may be disposed in the non-display are NDA.

The pixel PXL may include sub-pixels SPX1 to SPX3. For example, the pixel PXL may include a first sub-pixel SPX1, a second sub-pixel SPX2, and a third sub-pixel SPX3.

Each of the sub-pixels SPX1 to SPX3 may emit light of a color (e.g., a predetermined or selectable color). In some embodiments, the sub-pixels SPX1 to SPX3 may emit rays of light (or lights) of different colors. In an example, the first sub-pixel SPX1 may emit light of a first color, the second sub-pixel SPX2 may emit light of a second color, and the third sub-pixel SPX3 may emit light of a third color. For example, the first sub-pixel SPX1 may be a red pixel emitting light of red, the second sub-pixel SPX2 may be a green pixel emitting light of green, and the third sub-pixel SPX3 may be a blue pixel emitting light of blue. However, the disclosure is not limited thereto.

In an embodiment, the first sub-pixel SPX1, the second sub-pixel SPX2, and the third sub-pixel SPX3 may have, as light sources, a light emitting element of the first color, a light emitting element of the second color, and a light emitting element of the third color, to emit rays of light of the first color, the second color, and the third color, respectively. In another embodiment, the first sub-pixel SPX1, the second sub-pixel SPX2, and the third sub-pixel SPX3 may have light emitting elements emitting light of a same color and include color conversion layers and/or color filters of different colors, which are disposed above the respective light emitting elements, to respectively emit rays of light of the first color, the second color, and the third color. However, the colors, types, and/or numbers of sub-pixels SPX1 to SPX3 forming each pixel PXL are not particularly limited. For example, the color of light emitted from each pixel PXL may be variously changed.

The sub-pixels SPX1 to SPX3 may be regularly arranged according to a stripe structure, a PENTILE' structure, or the like. For example, the first, second, and third sub-pixels SPX1, SPX2, and SPX3 may be sequentially and repeatedly disposed in a first direction DR1. The first, second, and third sub-pixels SPX1, SPX2, and SPX3 may be repeatedly disposed in a second direction DR2. At least one first sub-pixel SPX1, at least one second sub-pixel SPX2, and at least one third sub-pixel SPX3 may constitute a pixel PXL capable of emitting rays of light of various colors. However, the arrangement structure of the sub-pixels SPX1 to SPX3 is not limited thereto, and the sub-pixels SPX1 to SPX3 may be arranged in the display area DA in various structures and/or various manners.

In an embodiment, each of the sub-pixels SPX1 to SPX3 may be formed as an active pixel. For example, each of the sub-pixels SPX1 to SPX3 may include at least one light source (e.g., at least one light emitting element) driven by a control signal (e.g., a scan signal and a data signal) and/or a power source (e.g., a first power source and a second power source). However, the kind, structure, and/or driving method of the sub-pixels SPX1 to SPX3, which can be applied to the display device, are not particularly limited.

FIGS. 2A, 2B, and 2C are schematic diagrams of equivalent circuits illustrating an embodiment of the sub-pixel included in the display device shown in FIG. 1.

In some embodiments, a sub-pixel SPX shown in FIGS. 2A to 2C may be at least one of the first sub-pixel SPX1, the second sub-pixel SPX2, and the third sub-pixel SPX3, which are provided in the display panel PNL shown in FIG. 1. The first sub-pixel SPX1, the second sub-pixel SPX2, and the third sub-pixel SPX3 may have structures substantially identical or similar to one another.

Referring to FIGS. 2A to 2C, the sub-pixel SPX may include a light source part LSU for generating light with a luminance corresponding to a data signal and a pixel circuit PXC for driving the light source part LSU.

The light source part LSU may include at least one light emitting element LD electrically connected between a first power source VDD and a second power source VSS. The first power source VDD and the second power source VSS may have different potentials such that the light emitting element LD can emit light. In an example, the first power source VDD may be set as a high-potential power source, and the second power source VSS may be set as a low-potential power source. A potential difference between the first power source VDD and the second power source VSS may be set substantially equal to or greater than a threshold voltage of the light emitting element LD during an emission period of at least the sub-pixel SPX.

The light emitting element LD may emit light with a luminance corresponding to a driving current supplied through the pixel circuit PXC. The light emitting element LD may be formed as an organic light emitting diode or an inorganic light emitting diode such as a micro light emitting diode or a quantum dot light emitting diode. In an embodiment, the light emitting element LD may be a light emitting diode having a subminiature size, e.g., a size small to a degree of nanometer scale to micrometer scale, which is manufactured by using a material having an inorganic crystalline structure.

In an embodiment, the light source part LSU may include light emitting elements LD connected in parallel to each other.

As shown in FIG. 2B, the light source part LSU may include a first electrode CNE1 electrically connected to the first power source VDD via the pixel circuit PXC and a first power line PL1, a second electrode CNE2 electrically connected to the second power source VSS through a second power line PL2, and light emitting elements LD electrically connected to each other in a same direction between the first and second electrodes CNE1 and CNE2. In an embodiment, the first electrode CNE1 may be or correspond to an anode electrode, and the second electrode CNE2 may be or correspond to a cathode electrode.

The light emitting element LD may include a first end portion (e.g., a p-type end portion) electrically connected to the first power source VDD through the first electrode CNE1 and/or the pixel circuit PXC and a second end portion (e.g., an n-type end portion) electrically connected to the second power source VSS through the second electrode CNE2. For example, the light emitting elements LD may be connected in parallel in a forward direction between the first and second electrodes CNE1 and CNE2. The light emitting elements LD connected in the forward direction between the first and second electrodes CNE1 and CNE2 may respectively form effective light sources, and these effective light sources may constitute the light source part LSU of the pixel PXL.

An end portion (e.g., a p-type end portion) of the light emitting element LD may be commonly connected to the pixel circuit PXC through an electrode (e.g., the first electrode CNE1) of the light source part LSU, and be electrically connected to the first power source VDD through the pixel circuit PXC and the first power line PL1. Another end portion (e.g., an n-type end portion) of the light emitting element LD may be commonly connected to the second power source VSS through another electrode (e.g., the second electrode CNE2) of the light source part LSU and the second power line PL2.

In another embodiment, the light source part LSU may include light emitting elements LD connected in series. For example, the light source part LSU may include light emitting elements LD which constitute at least two serial stages and are connected in series/parallel to each other.

As shown in FIG. 2C, the light source part LSU may include light emitting elements LD which constitute at least two serial stages and are connected in series/parallel to each other. Each serial stage may include a pair of electrodes (e.g., two electrodes) and at least one light emitting element LD electrically connected between the pair of electrodes. Numbers of light emitting elements LD constituting the respective serial stages may be substantially equal to or different from each other, and the number of light emitting elements LD is not particularly limited. For example, a first serial stage may include at least one first light emitting element LD1 electrically connected between a first electrode CNE1 and an intermediate electrode CTE (or third electrode), and a second serial stage may include at least one second light emitting elements LD2 electrically connected between an intermediate electrode CTE and a second electrode CNE2.

In case that the light source part LSU is configured by using light emitting elements LD having a same condition (e.g., a same size and/or a same number) as effective light sources, power efficiency can be improved in case that the light emitting elements LD are connected in a series structure or a series/parallel hybrid structure. For example, in a light source part LSU in which light emitting elements LD are connected in series or series/parallel, a high luminance may be expressed by using a same current, as compared with a light source part LSU in which light emitting elements LD are connected only in parallel. In the light source part LSU in which light emitting elements LD are connected in series or series/parallel, a same luminance may be expressed by using a low driving current, as compared with the light source part LSU in which light emitting elements LD are connected only in parallel. In a sub-pixel SPX in which light emitting elements LD are connected in a series structure or a series/parallel hybrid structure, although a short circuit defect or the like occurs in some series stages, a luminance to a certain degree may be expressed through light emitting elements LD of the other serial states. Thus, a possibility that a dark spot defect will occur in the sub-pixel SPX can be reduced.

The pixel circuit PXC may be electrically connected between the first power source VDD and the light source part LSU. The pixel circuit PXC may be electrically connected to a scan line Si (or gate line) and a data line Dj. The pixel circuit PXC may be further electrically connected to a sensing control line SSi and a sensing line SLj. In an example, in case that the sub-pixel SPX is disposed on an ith (where i is a natural number) horizontal line (row or pixel row) and a jth (where j is a natural number) vertical line (column or pixel column) of the display area DA, the pixel circuit PXC of the sub-pixel SPX may be electrically connected to an ith scan line Si, an ith sensing control line SSi, a jth data line Dj, and a jth sensing line SLj.

In some embodiments, the pixel circuit PXC may include transistors and at least one capacitor. For example, the pixel circuit PXC may include a first transistor T1, a second transistor T2, a third transistor T3, and a storage capacitor Cst.

The first transistor T1 may be electrically connected between the first power source VDD and the light source part LSU. For example, a first electrode (e.g., a drain electrode) of the first transistor T1 may be electrically connected to the first power source VDD, and a second electrode (e.g., a source electrode) of the first transistor T1 may be electrically connected to an electrode (e.g., an anode electrode) of the light source part LSU. A gate electrode of the first transistor T1 may be electrically connected to a first node N1. A back-gate electrode of the first transistor T1 may be electrically connected to a second node N2. The first transistor T1 may control a driving current supplied to the light source part LSU, corresponding to a voltage of the first node N1. For example, the first transistor T1 may be a driving transistor for controlling a driving current of the sub-pixel SPX.

The second transistor T2 may be electrically connected between the data line Dj and the first node N1. For example, a first electrode (e.g., a source electrode) of the second transistor T2 may be electrically connected to the data line Dj, and a second electrode (e.g., a drain electrode) of the second transistor T2 may be electrically connected to the first node N1. A gate electrode of the second transistor T2 may be electrically connected to the scan line Si. The second transistor T2 may be turned on in case that a scan signal SCi having a gate-on voltage (e.g., a high level voltage) is supplied from the scan line Si, to electrically connect the data line Dj and the first node N1 to each other. A data signal DSj of a corresponding frame may be supplied to the data line Dj for each frame period. The data signal DSj may be transferred to the first node N1 through the second transistor T2 turned on during a period in which the scan signal SCi having the gate-on voltage is supplied. For example, the second transistor T2 may be a switching transistor for transferring each data signal DSj to the inside of the sub-pixel SPX.

The third transistor T3 may be electrically connected between the first transistor T1 and the sensing line SLj. For example, a first electrode of the third transistor T3 may be electrically connected to the sensing line SLj, and a second electrode of the third transistor T3 may be electrically connected to the second node N2 (or the second electrode of the first transistor T1). A gate electrode of the third transistor T3 may be connected to the sensing control line SSi. In case that the sensing control line SSi is omitted, the gate electrode of the third transistor T3 may be connected to the scan line Si (a previous scan line located on a row prior to a row on which the scan line Si is located, or a subsequent scan line located on a row posterior to a row on which the scan line Si is located). The third transistor T3 may be turned on by a sensing control signal SSCi having a gate-on voltage supplied to the sensing control line SSi during a sensing period (e.g., a predetermined or selectable sensing period), to electrically connect the sensing line SLj and the first transistor T1 to each other.

In some embodiments, a sensing period may be a period for extracting a characteristic of the sub-pixel SPX (e.g., a threshold voltage of the first transistor T1, or the like) disposed in the display area DA. During the sensing period, a reference (e.g., a predetermined or selectable reference voltage) at which the first transistor T1 can be turned on may be supplied through the data line Dj and the second transistor T2, or the first transistor T1 may be turned on by connecting each sub-pixel SPX to a current source or the like. The first transistor T1 may be electrically connected to the sensing line SLj as the third transistor T3 is turned on by supplying the sensing control signal SSCi having the gate-on voltage to the third transistor T3. Subsequently, the sensing signal SENj is output to an external device through the sensing line SLj, and a characteristic of each sub-pixel SPX, including the threshold voltage of the first transistor T1, or the like, is detected by using the sensing signal SENj.

A first electrode of the storage capacitor Cst may be electrically connected to the second node N2, and a second electrode of the storage capacitor Cst may be electrically connected to the first node N1. The storage capacitor Cst charges a voltage corresponding to the data signal DSj supplied to the first node N1 during each frame period.

Although FIGS. 2A to 2C illustrate that the transistors, e.g., the first, second, and third transistors T1, T2, and T3, which are included in the pixel circuit PXC, are all N-type transistors, the disclosure is not limited thereto, and at least one of the first, second, and third transistors T1, T2, and T3 may be changed to a P-type transistor. The pixel circuit PXC may be formed as a pixel circuit using various structure and/or various driving methods.

FIG. 3 is a schematic diagram of an equivalent circuit illustrating an embodiment of the sub-pixels included in the display device shown in FIG. 1. FIG. 3 illustrates, as an example, some sub-pixels included in a horizontal line.

Referring to FIGS. 1 and 3, a first pixel PXL_ODD (an odd-numbered pixel or a pixel of an odd-numbered column) and a second pixel PXL_EVEN (an even-numbered pixel or a pixel of an even-numbered column) may be located on a horizontal line. The first pixel PXL_ODD and the second pixel PXL_EVEN are merely named according to their positions, and each of the first pixel PXL_ODD and the second pixel PXL_EVEN may be substantially identical to the pixel PXL. The first pixel PXL_ODD and the second pixel PXL_EVEN may be sequentially and repeatedly arranged in the first direction DR1.

Each of the first pixel PXL_ODD and the second pixel PXL_EVEN may include first, second, and third sub-pixels SPX1, SPX2, and SPX3 (see FIG. 1). First, second, and third sub-pixels SPX1_O, SPX2_O, and SPX3_O (or odd-numbered first, second, and third sub-pixels) respectively mean first, second, and third sub-pixels SPX1, SPX2, and SPX3 included in the first pixel PXL_ODD, and first, second, and third sub-pixels SPX1_E, SPX2_E, and SPX3_O (or even-numbered first, second, and third sub-pixels) respectively mean first, second, and third sub-pixels SPX1, SPX2, and SPX3 included in the second pixel PXL_EVEN.

Gate lines SC_ODD and SC_EVEN may extend in the first direction DR1 and be arranged in the second direction DR2. The sub-pixels SPX1_O to SPX3_O and SPX1_E to SPX3_E included in a horizontal line may be sequentially arranged in the first direction DR1. The sub-pixels SPX1_O to SPX3_O and SPX1_E to SPX3_E may be substantially located between a first gate line SC_ODD and a second gate line SC_EVEN, and be connected to the first gate line SC_ODD and the second gate line SC_EVEN. Each of the first gate line SC_ODD (an odd-numbered scan line or a first scan line) and the second gate line SC_EVEN (an even-numbered scan line or a second scan line) may correspond to the scan line Si or the sensing control line SSi, which is shown in FIGS. 2A to 2C.

Data lines D0 to D6 may extend in the second direction DR2 and be arranged in the first direction DR1. A distance between closest even data lines of the data lines D0 to D6 may be greater than a distance between adjacent sub-pixels of the sub-pixels SPX1_O to SPX3_O and SPX1_E to SPX3_E. For example, closest even data lines among the data lines D0 to D6 may be spaced apart from each other with two of the sub-pixels SPX1_O to SPX3_O and SPX1_E to SPX3_E, which are interposed therebetween. However, the distance between the data lines D0 to D6 is not limited thereto. For example, closest even data lines among the data lines D0 to D6 may be spaced apart from each other with three of the sub-pixels SPX1_O to SPX3_O and SPX1_E to SPX3_E, which are interposed therebetween.

Similar to the data lines D0 to D6, sensing lines SL1 to SL5 may extend in the second direction DR2 and be arranged in the first direction DR1. A distance between the sensing lines SL1 to SL5 may be substantially equal to the distance between the data lines D0 to D6. For example, the sensing lines SL1 to SL5 may be spaced apart from each other with two of the sub-pixels SPX1_O to SPX3_O and SPX1_E to SPX3_E, which are interposed therebetween.

In some embodiments, the data lines D0 to D6 and the sensing lines SL1 to SL6 may be alternately arranged in the first direction DR1 with one of the sub-pixels SPX1_O to SPX3_O and SPX1_E to SPX3_E, which are interposed therebetween.

A first sensing line SL1 (or first signal line) may be located between a first sub-pixel SPX1_O and a second sub-pixel SPX2_O of the first pixel PXL_ODD, and a second data line D2 (or second signal line) may be located between the second sub-pixel SPX2_O and a third sub-pixel SPX3_O of the first pixel PXL_ODD. Similarly, a third sensing line SL3 (or third signal line) may be located between the third sub-pixel SPX3_O of the first pixel PXL_ODD and a first sub-pixel SPX1_E of the second pixel PXL_EVEN, and a fourth data line DL4 (or fourth signal line) may be located between the first sub-pixel SPX1_E and a second sub-pixel SPX2_E of the second pixel PXL_EVEN. A fifth sensing line SL5 (or fifth signal line) may be located between the second sub-pixel SPX2_E and a third sub-pixel SPX3_E of the second pixel PXL_EVEN, and a sixth data line D6 (or sixth signal line) may be located at a right side of the third sub-pixel SPX3_E of the second pixel PXL_EVEN. A reference data line D0 may be located at a left side of the first sub-pixel SPX1_O of the first pixel PXL_ODD. For example, the data lines D0 to D6 may be located corresponding to an even-numbered column (or odd-numbered column), and the sensing lines SL1 to SL5 be located corresponding to an odd-numbered column (or even-numbered column).

In embodiments, two sub-pixels which emit light of a same color and are adjacent to each other among the sub-pixels SPX1_O to SPX3_O and SPX1_E to SPX3_E may share a data line.

For example, as shown in FIG. 3, the two first sub-pixels SPX1_O and SPX1_E emitting light of the first color may be electrically connected to the second data line D2. The two third sub-pixels SPX3_O and SPX3_E emitting light of the third color may be electrically connected to the fourth data line D4. The second sub-pixel SPX2_E emitting light of the second color may be electrically connected to the sixth data line D6, and share the sixth data line D6 with another second sub-pixel (e.g., a second sub-pixel of a third pixel) to be located at a right side of the second pixel PXL_EVEN. The second sub-pixel SPX2_O of the first pixel PXL_ODD may be electrically connected to the reference data line D0. The second sub-pixel SPX2_O of the first pixel PXL_ODD may not share any data line with another second sub-pixel, but the disclosure is not limited thereto. For example, a dummy sub-pixel may be provided at a left side of the first pixel PXL_ODD, and the second sub-pixel SPX2_O of the first pixel PXL_ODD may share the reference data line D0 with the dummy sub-pixel.

Two sub-pixels share a data line, so that the number of data lines in the display device can be decreased. As a distance between the sub-pixels SPX1_O to SPX3_O and SPX1_E to SPX3_E is decreased, the resolution of the display device can be relatively improved. Two sub-pixels emitting light of a same color share a data line, so that a charging time (or a recording time of a data signal with respect to a sub-pixel) can be more sufficiently secured. For example, a first voltage range of a first data signal for a first color sub-pixel may be different from a second voltage range of a second data signal for a second color sub-pixel. A fluctuation range of a data signal in case that the first and second color sub-pixels share a data line may be greater than a fluctuation range of a data signal in case that first color sub-pixels share a data line. Accordingly, a transition time of a data signal (for example, a time at which the data signal fluctuates in the first and second voltage ranges) in case that the first and second color sub-pixels share a data line may be greater than a transition time of a data signal (for example, a time at which the data signal fluctuates in the first voltage range or the second voltage range) in case that first color sub-pixels (or second color sub-pixels) share a data line. Thus, in case that sub-pixels emitting light of a same color share a data line, a charging time except the transition time in a same horizontal time can be more sufficiently secured, and accordingly, the sub-pixel can emit light with a more accurate luminance, based on a more accurately recorded data signal. As another example, in case that the charging time has already been sufficiently secured (or in case that the charging time is fixed), a horizontal time can be decreased, and the display device can be driven at a higher driving frequency (or refresh rate).

In embodiments, two sub-pixels adjacent to each other among the sub-pixels SPX1_O to SPX3_O and SPX1_E to SPX3_E may share a sensing line.

For example, the first sub-pixel SPX1_O and the second sub-pixel SPX2_O of the first pixel PXL_ODD may be electrically connected to the first sensing line SL1. The third sub-pixel SPX3_O of the first pixel PXL_ODD and the first sub-pixel SPX1_E of the second pixel PXL_EVEN may be electrically connected to the third sensing line SL3. The second sub-pixel SPX2_E and the third sub-pixel SPX3_E of the second pixel PXL_EVEN may be electrically connected to the fifth sensing line SL5.

FIGS. 4 and 5 are schematic layout views illustrating the sub-pixels shown in FIG. 3. FIGS. 4 and 5 illustrates a layout of the sub-pixels based on the pixel circuit PXC (or pixel circuit layer) of the sub-pixel SPX shown in FIG. 2C.

Referring to FIGS. 3 to 5, the first sub-pixel SPX1_O and the third sub-pixel SPX3_O of the first pixel PXL_ODD and the second sub-pixel SPX2_E of the second pixel PXL_EVEN may have a substantially same pixel structure (or circuit structure), the second sub-pixel SPX2_O of the first pixel PXL_ODD and the first sub-pixel SPX1_E and the third sub-pixel SPX3_E of the second pixel PXL_EVEN may have a substantially same pixel structure, and the first sub-pixels SPX1_O and SPX1_E may have pixel structures reversed to each other in the second direction DR2. Therefore, a common configuration of the sub-pixels SPX1_O to SPX3_E will be described based on the first sub-pixel SPX1_O of the first pixel PXL_ODD (and the first sub-pixel SPX1_E of the second pixel PXL_EVEN), and overlapping descriptions will not be repeated.

A first vertical power line PL1_V, sensing lines SL1 to SL5, data lines D2 to D6, and a second vertical power line PL2_V may extend substantially in the second direction DR2, and be arranged in the first direction DR1. The sensing lines SL1 to SL5 may have a partially bent shape, but the disclosure is not limited thereto.

With respect to a first capacitor electrode CE1 of the first sub-pixel SPX1_O, the first vertical power line PL1_V may be disposed in a left direction, and the second vertical power line PL2_V may be disposed in a right direction. The sensing lines SL1 to SL5 and the data lines D2 to D6 may be disposed in the right direction of a first capacitor electrode CE1 of a corresponding sub-pixel. For example, the first sensing line SL1 may be disposed in the right direction of the first capacitor electrode CE1 of the first sub-pixel SPXL_O, and the fourth data line D4 may be disposed in the right direction of the first sub-pixel SPX1_E.

The first vertical power line PL1_V, the sensing lines SL1 to SL5, the data lines D2 to D6, the second vertical power line PL2_V, and the first capacitor CE1 may include a same material, and be disposed in a same layer through a same process.

A second horizontal power line PL2_H, a first gate line SC_ODD, a second gate line SC_EVEN, and a first horizontal power line PL1_H may extend in the first direction DR1, and be arranged in the second direction DR2. With respect to a second capacitor electrode CE2 of the first sub-pixel SPX1_O, the second horizontal power line PL2_H and the first gate line SC_ODD may be disposed in an upper direction, and the second gate line SC_EVEN and the first horizontal power line PL1_H may be disposed in a lower direction.

The second horizontal power line PL2_H, the first gate line SC_ODD, the second gate line SC_EVEN, the first horizontal power line PL1_H, the second capacitor electrode CE2, and first, second, and third connection patterns CNP1, CNP2, and CNP3 may include a same material, and be disposed in a same layer through a same process.

The second capacitor electrode CE2 and the first capacitor electrode CE1 may overlap each other and constitute a storage capacitor Cst (see FIG. 2C).

The second horizontal power line PL2_H may intersect the second vertical power line PL2_V, and be connected to the second vertical power line PL2_V through a contact hole (and a bridge pattern in an intersecting area therebetween. The second horizontal power line PL2_H and the second vertical power line PL2_V may entirely form a mesh structure, and constitute a second power line PL2 (see FIG. 2C).

Similarly, the first horizontal power line PL1_H may intersect the first vertical power line PL1_V, and be connected to the first vertical power line PL1_V through a contact hole (and a bridge pattern in an intersecting area therebetween. The first horizontal power line PL1_H and the first vertical power line PL1_V may entirely form a mesh structure, and constitute a first power line PL1 (see FIG. 2C). The arrangement of the first horizontal power line PL1_H and the second horizontal power line PL2_H may be changed.

A first semiconductor pattern ACT1 is located in the lower direction of the first and second capacitor electrodes CE1 and CE2, and may partially overlap the first and second capacitor electrodes CE1 and CE2. A central portion of the first semiconductor pattern ACT1 overlapping the first and second capacitor electrodes CE1 and CE2 may constitute a channel of a first transistor T1 (see FIG. 2C), the second capacitor electrode CE2 may constitute a gate electrode of the first transistor T1, and the first capacitor electrode CE1 may constitute a back-gate electrode of the first transistor T1. A first part of the first semiconductor pattern ACT1 may be electrically connected to a protrusion part of the first vertical power line PL1_V through a first bridge pattern BRP1 (see FIG. 5) (and a contact hole). The first part of the first semiconductor pattern ACT1 or the bridge pattern BRP1 may be a first electrode of the first transistor T1. A second part of the first semiconductor pattern ACT1 may be electrically connected to the first capacitor electrode CE1 through a second bridge pattern BRP2 (see FIG. 5) at an opening portion of the second capacitor electrode CE2. The second part of the first semiconductor pattern ACT1 or the second bridge pattern BRP2 may be a second electrode of the first transistor T1.

A second semiconductor pattern ACT2 is located in the upper direction of the second capacitor electrode CE2, and may partially overlap the first gate line SC_ODD. A central portion of the second semiconductor pattern ACT2 overlapping the first gate line SC_ODD may constitute a channel of a second transistor T2 (see FIG. 2C), and the first gate line SC_ODD may constitute a gate electrode of the second transistor T2. The first gate line SC_ODD may serve as a scan line Si (see FIG. 2C) of the first sub-pixel SPX1_O. A second part of the second semiconductor pattern ACT2 may be electrically connected to the second capacitor electrode CE2 through a fourth bridge pattern BRP4 (and a contact hole). The second part of the second semiconductor pattern ACT2 or the fourth bridge pattern BRP4 may be a second electrode of the second transistor T2. A first part of the second semiconductor pattern ACT2 may be electrically connected to the first connection pattern CNP1 through a third bridge pattern BRP3 (and a contact hole). The first part of the second semiconductor pattern ACT2 or the third bridge pattern BRP3 may be a first electrode of the second transistor T2. The first connection pattern CNP1 may extend in the first direction DR1 to the second data line D2 across the second vertical power line PL2_V and the first vertical power line PL1_V (or the second sub-pixel SPX2_O), and be electrically connected to the second data line D2 through a seventh bridge pattern BRP7.

A third semiconductor pattern ACT3 is located in upper direction of the first capacitor electrode CE1, and may partially overlap the first gate line SC_ODD. A central portion of the third semiconductor pattern ACT3 overlapping the first gate line SC_ODD may constitute a channel of a third transistor T3 (see FIG. 2C), and the first gate line SC_ODD may constitute a gate electrode of the third transistor T3. The first gate line SC_ODD may serve as a sensing control line SSi (see FIG. 2C) of the first sub-pixel SPX1_O. A second part of the third semiconductor pattern ACT3 may be electrically connected to the first capacitor electrode CE1 through a sixth bridge pattern BRP6 (and a contact hole). The second part of the third semiconductor pattern ACT3 or the sixth bridge pattern BRP6 may be a second electrode of the third transistor T3. A first part of the third semiconductor pattern ACT3 may be electrically connected to the first sensing line SL1 through a fifth bridge pattern BRP5 (and a contact hole). The first part of the third semiconductor pattern ACT3 or the fifth bridge pattern BRP5 may be a first electrode of the third transistor T3.

In the first sub-pixel SPX1_E of the second pixel PXL_EVEN, a first semiconductor pattern ACT1_1 may be located in the upper direction of the first and second capacitor electrodes CE1 and CE2. The first semiconductor pattern ACT1_1 may constitute a first transistor T1 (see FIG. 2C) of the first sub-pixel SPX1_E.

In the first sub-pixel SPX1_E of the second pixel PXL_EVEN, a second semiconductor pattern ACT2_1 is located in the lower direction of the second capacitor electrode CE2, and may partially overlap the second gate line SC_EVEN. A central portion of the second semiconductor pattern ACT2_1 overlapping the second gate line SC_EVEN may constitute a channel of a second transistor T2 (see FIG. 2C), and the second gate line SC_EVEN may constitute a gate electrode of the second transistor T2. The second gate line SC_EVEN may serve as a scan line Si (see FIG. 2C) of the first sub-pixel SPX1_E of the second pixel PXL_EVEN. A first part of the second semiconductor pattern ACT2_1 may be electrically connected to the second connection pattern CNP2 through a third bridge pattern BRP3_1 (and a contact hole). The second connection pattern CNP2 may extend in the opposite direction of the first direction DR1 to the second data line D2 across the first vertical power line PL1_V and the second vertical power line PL2_V (or the third sub-pixel SPX3_O), and be electrically connected to the second data line D2 through an eighth bridge pattern BRP8.

In the first sub-pixel SPX1_E of the second pixel PXL_EVEN, a third semiconductor pattern ACT3_1 is located in the lower direction of the first capacitor electrode CE1, and may partially overlap the second gate line SC_E-VEN. A central portion of the third semiconductor pattern ACT3_1 overlapping the second gate line SC_EVEN may constitute a channel of a third transistor T3 (see FIG. 2C), and the second gate line SC_EVEN may constitute a gate electrode of the third transistor T3. The second gate line SC_EVEN may serve as a sensing control line SSi (see FIG. 2C) of the first sub-pixel SPX1_E of the second pixel PXL_EVEN. A first part of the third semiconductor pattern ACT3_1 may be electrically connected to the third connection pattern CNP3 through a fifth bridge pattern BRP5_1 (and a contact hole). The third connection pattern CNP3 may extend in the opposite direction of the first direction DR1 to the third sensing line SL3, and be electrically connected to the third sensing line SL3 through a ninth bridge pattern BRP9.

The semiconductor patterns ACT1 to ACT3 and ACT1_1 to ACT3_1 may include a same material, and be disposed in a same layer through a same process. The semiconductor patterns ACT1 to ACT3 and ACT1_1 to ACT3_1 may include poly-silicon, amorphous silicon, an oxide semiconductor, and the like.

A first alignment electrode ELT1, a second alignment electrode ELT2, and a third alignment electrode ELT3 may extend in the second direction DR2 and be arranged in the first direction DR1. The first alignment electrode ELT1, the second alignment electrode ELT2, and the third alignment electrode ELT3 may respectively overlap a dummy power line PL_D, the second vertical power line PL2_V, and the first vertical power line PL1_V. The second alignment electrode ELT2 may be electrically connected to the second vertical power line PL2_V through a contact hole (and a bridge pattern). Similarly, the third alignment electrode ELT3 may be electrically connected to the first vertical power line PL1_V through a contact hole, but the disclosure is not limited thereto. The first alignment electrode ELT1 may also be electrically connected to the dummy power line PL_D through a contact hole, but the disclosure is not limited thereto. The alignment electrodes ELT1 to ELT3 and the bridge patterns BRP1 to BRP9 may include a same material, and be disposed in a same layer through a same process.

FIG. 6 is a schematic view illustrating an embodiment of the first sub-pixel shown in FIG. 5. FIG. 6 illustrates the first sub-pixel SPX1_O based on the light source part LSU (see FIG. 2C). The sub-pixels SPX1_O to SPX3_O and SPX1_E to SPX3_E shown in FIG. 5 may include substantially a same light source part LSU.

Referring to FIGS. 5 and 6, alignment electrodes ELT1 to ELT3 may be used as alignment electrodes for aligning a light emitting element LD. In a manufacturing process of the display device, the light emitting element LD may be aligned in a desired direction and/or at a desired position by an electric field formed between the alignment electrodes ELT1 to ELT3. In some embodiments, at least some of the alignment electrodes ELT1 to ELT3 may be used as a driving electrode for driving the light emitting element LD.

A first electrode CNE1 may overlap a first end portion of a first light emitting element LD1 and a first alignment electrode ELT1. The first electrode CNE1 may overlap a second bridge pattern BRP2. The first electrode CNE1 may electrically connect the first end portion of the first light emitting element LD1 and the second bridge pattern BRP2 to each other.

A second electrode CNE2 may overlap a second end portion of a second light emitting element LD2 and a second alignment electrode ELT2. The second electrode CNE2 may electrically connect the second end portion of the second light emitting element LD2 and the second alignment electrode ELT2 to each other.

An intermediate electrode CTE may overlap a second end portion of the first light emitting element LD1 and the second alignment electrode ELT2. The intermediate electrode CTE may overlap a first end portion of the second light emitting element LD2 and a third alignment electrode ELT3. The intermediate electrode CTE may electrically connect the second end portion of the first light emitting element LD1 and the first end portion of the second light emitting element LD2 to each other. The intermediate electrode CTE may extend in a shape detouring around the second electrode CNE2, but the disclosure is not limited thereto. For example, the intermediate electrode CTE may be disposed in a shape surrounding the second electrode CNE. The shape of the second electrode CNE may be variously changed within a range in which the second end portion of the first light emitting element LD1 and the first end portion of the second light emitting element LD2 are connected to each other.

Each of the alignment electrodes ELT1 to ELT3 and the first and second electrodes CNE1 and CNE2 may have a bar shape extending in the second direction DR2 in a plan view, but the disclosure is not limited thereto. In some embodiments, the shape of each of the alignment electrodes ELT1 to ELT3 and the first and second electrodes CNE1 and CNE2 may be variously changed according to arrangements and/or series/parallel structures of the light emitting element LD.

The light emitting element LD may be disposed between the alignment electrodes ELT1 to ELT3 such that a length direction of the light emitting element LD is parallel to the first direction DR1. For example, the first light emitting element LD1 may be disposed between the first and second alignment electrodes ELT1 and ELT2, and the second light emitting element LD2 may be disposed between the second and third alignment electrodes ELT2 and ELT3. A length of the light emitting element LD in the first direction DR1 may be substantially equal to or similar to a length of the alignment electrodes ELT1 to ELT3.

FIG. 7 is a schematic cross-sectional view illustrating an embodiment of the first sub-pixel taken along line I-I' shown in FIG. 6.

FIG. 7 illustrates the first sub-pixel SPX1_O (or sub-pixel) in which each electrode is only a single-film electrode and each insulating layer is only a single-film insulating layer. However, the disclosure is not limited thereto.

Referring to FIGS. 5 to 7, the first sub-pixel SPX1_O may include a pixel circuit layer PCL and a display element layer DPL, which are disposed on a substrate SUB.

For convenience of description, the pixel circuit layer PCL will be described, and the display element layer DPL will be described.

The pixel circuit layer PCL may include a first conductive layer (or first metal layer), a first transistor T1, and a second conductive layer (or second metal layer).

The first conductive layer may be disposed on the substrate SUB, and include a first vertical power line PL1_V, a back-gate electrode BGE, a first capacitor electrode CE1, a first sensing line SL1, a dummy power line PL_D, and a second vertical power line PL2_V.

The first conductive layer may be formed in a single layer including at least one selected from the group consisting of copper (Cu), molybdenum (Mo), tungsten (W), aluminum neodymium (AlNd), titanium (Ti), aluminum (Al), silver (Ag), and any alloy thereof or a mixture thereof, or be formed in a double- or multi-layer structure including molybdenum (Mo), titanium (Ti), copper (Cu), aluminum (Al) or silver (Ag), which is a low-resistance material so as to decrease wiring resistance.

A buffer layer BFL may be provided and/or formed on the substrate SUB and the first conductive layer, and prevent an impurity from being diffused into the first transistor T1. The buffer layer BFL may be an inorganic insulating layer including an inorganic material. The buffer layer BFL may include at least one of silicon nitride ($SiN_x$), silicon oxide ($SiO_x$), silicon oxynitride ($SiO_xN_y$), and metal oxide such as aluminum oxide ($AlO_x$). The buffer layer BFL may be provided as a single layer, but be provided as a multi-layer including at least two layers. In case that the buffer layer BFL is provided as the multi-layer, the layers may be formed of a same material or be formed of different materials. The buffer layer BFL may be omitted according to a material of the substrate SUB, a process condition, and the like.

A first semiconductor pattern ACT1 of the first transistor T1 may be provided and/or formed on the buffer layer BFL. The first semiconductor pattern ACT1 may include a first contact region (or first transistor electrode TE1), a second contact region (or second transistor electrode TE2), and a channel region between the first and second contact regions. The first contact region may contact the first bridge pattern BRP1 shown in FIG. 4, and the second contact region may contact a second bridge pattern BRP2. The channel region may overlap a gate electrode GE of the first transistor T1. The first semiconductor pattern ACT1 may be a semiconductor pattern made of amorphous silicon, poly-silicon, low temperature poly-silicon, an oxide semiconductor, or the like. The channel region is, for example, a semiconductor pattern undoped with an impurity, and may be an intrinsic semiconductor. Each of the first contact region and the second contact region may be a semiconductor pattern doped with the impurity.

A gate insulating layer GI may be disposed over the first semiconductor pattern ACT1. The gate insulating layer GI may be an inorganic insulating layer including an inorganic material. In an example, the gate insulating layer GI may include at least one of silicon nitride ($SiN_x$), silicon oxide ($SiO_x$), silicon oxynitride ($SiO_xN_y$), and metal oxide such as aluminum oxide ($AlO_x$). However, the material of the gate insulating layer GI is not limited to the above-described embodiments. In some embodiments, various materials which give an insulating property to the gate insulating layer GI may be applied. In an example, the gate insulating layer GI may be an organic insulating layer including an organic material. The gate insulating layer GI may be provided as a single layer, and may also be provided as a multi-layer including at least two layers.

The second conductive layer may be disposed on the gate insulating layer GI, and may include the gate electrode GE of the first transistor T1 and a second capacitor electrode CE2. The gate electrode GE may overlap the channel region of the first semiconductor pattern ACT1. The second capacitor electrode CE2 may overlap the first capacitor electrode CE1, and the first capacitor electrode CE1 and the second capacitor electrode CE2 may constitute a capacitor Cst. The second conductive layer and the first conductive layer may include a same material, or the second conductive layer may include one or more materials selected from the materials that may be used to form the first conductive layer, e.g., as discussed herein.

An interlayer insulating layer ILD (or protective layer PSV) may be disposed over the second conductive layer. The interlayer insulating layer ILD (or protective layer PSV) may be provided in a form including an organic insulating layer, an inorganic insulating layer, or the organic insulating layer disposed on the inorganic insulating layer. The inorganic insulating layer may include, for example, at least one of silicon oxide ($SiO_x$), silicon nitride ($SiN_x$), silicon oxynitride ($SiO_xN_y$), and metal oxide such as aluminum oxide ($AlO_x$). The organic insulating layer may include, for example, at least one of acrylic resin, epoxy resin, phenolic resin, polyamide resin, polyimide resin, unsaturated polyester resin, poly-phenylene ether resin, poly-phenylene sulfide resin, and benzocyclobutene resin.

The display element layer DPL may be provided on the interlayer insulating layer ILD (or protective layer PSV).

The display element layer DPL may include bank patterns BNP1 to BNP3, the second bridge pattern BRP2, alignment electrodes ELT1 to ELT3, light emitting elements LD, first and second electrodes CNE1 and CNE2, and an intermediate electrode CTE. The display element layer DPL may include first and second insulating layers INS1 and INS2.

The bank patterns BNP1 to BNP3 may be disposed on the interlayer insulating layer ILD (or protective layer PSV), and be spaced apart from each other. The bank patterns BNP1 to BNP3 may be support members respectively supporting the alignment electrodes ELT1 to ELT3 to change surface profiles (or shapes) of the alignment electrodes ELT1 to ELT3 such that light emitted from the light emitting element LD is guided in an image display direction of the display device (e.g., a third direction DR3). For example, the bank patterns BNP1 to BNP3 may respectively change the surface profiles (or shapes) of the alignment electrodes ELT1 to ELT3 in the third direction DR3.

Each of the bank patterns BNP1 to BNP3 may be provided and/or formed between the interlayer insulating layer ILD (or protective layer PSV) and a corresponding alignment electrode. For example, a first bank pattern BNP1 may be disposed on the bottom of a first alignment electrode ELT1, a second bank pattern BNP2 may be disposed on the bottom of a second alignment electrode ELT2, and a third bank pattern BNP3 may be disposed on the bottom of a third alignment electrode ELT3.

The bank patterns BNP1 to BNP3 may be an inorganic insulating layer including an inorganic material or an organic insulating layer including an organic material. In some embodiments, the first and second bank patterns BNP1 and BNP2 may include a single-film organic insulating layer and/or a single-film inorganic insulating layer, but the disclosure is not limited thereto. In some embodiments, the first and second bank patterns BNP1 and BNP2 may be provided in the form of a multi-layer in which at least one organic insulating layer and at least one inorganic insulating layer are stacked each other. However, the material of the bank patterns BNP1 to BNP3 is not limited to the above-described embodiments. In some embodiments, the bank patterns BNP1 to BNP3 may include a conductive material.

The bank patterns BNP1 to BNP3 may have a section which a trapezoidal shape, the width of which becomes narrower toward the top thereof in the third direction DR3, but the disclosure is not limited thereto. In some embodiments, the bank patterns BNP1 to BNP3 may include a curved surface having a section with a semi-elliptical shape, a semicircular shape (or hemispherical shape), or the like, the width of which becomes narrower toward the top thereof. In a cross-sectional view, the shape of the bank patterns BNP1 to BNP3 are not limited to the above-described embodiments, and may be variously changed within a range in which the efficiency of light emitted from each of the light emitting elements LD can be improved. The bank patterns BNP1 to BNP3 may have a same height (or thickness) in the third direction DR3.

Although a case where the bank patterns BNP1 to BNP3 are provided and/or formed on the interlayer insulating layer ILD (or protective layer PSV) is described in the above-described embodiment, the disclosure is not limited thereto. In some embodiments, the bank patterns BNP1 to BNP3 and the interlayer insulating layer ILD (or protective layer PSV) may be formed through a same process. The bank patterns BNP1 to BNP3 may be an area of the interlayer insulating layer ILD (or protective layer PSV). In some embodiments, the bank patterns BNP1 to BNP3 may be omitted.

The alignment electrodes ELT1 to ELT3 may be provided and/or formed over the bank patterns BNP1 to BNP3.

Each of the alignment electrodes ELT1 to ELT3 may be formed of (or configured with) a material having a constant reflexibility to allow light emitted from the light emitting element LD to advance in the image display direction of the display device DD. In an example, each of the alignment electrodes ELT1 to ELT3 may be configured with a conductive material having a constant reflexibility. The conductive material may include an opaque metal advantageous in reflecting light emitted from the light emitting element LD in the image display direction of the display device. The opaque metal may include, for example, metals such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and alloys thereof. In some embodiments, each of the alignment electrodes ELT1 to ELT3 may include a transparent conductive material. The transparent conductive material may include a conductive oxide such as indium tin oxide (ITO), indium zinc oxide (IZO), zinc oxide (ZnO), indium gallium zinc oxide (IGZO), or indium tin zinc oxide (ITZO), a conductive polymer such as poly(3,4-ethylenedioxythiophene (PE-DOT), and the like.

In case that each of the alignment electrodes ELT1 to ELT3 includes a transparent conductive material, a separated conductive layer may be added, which is made of an opaque metal for reflecting light emitted from the light emitting element LD in the image display direction of the display device. However, the material of each of the alignment electrodes ELT1 to ELT3 is not limited to the above-described materials.

Each of the alignment electrodes ELT1 to ELT3 may be provided and/or formed as a single layer, but the disclosure is not limited thereto. In some embodiments, each of the alignment electrodes ELT1 to ELT3 may be provided and/or formed as a multi-layer in which at least two materials among metals, alloys, conductive oxide, and conductive polymers are stacked each other. Each of the alignment electrodes ELT1 to ELT3 may be formed as a multi-layer including at least two layers so as to minimize distortion caused by a signal delay in case that a signal (or voltage) is transferred to the light emitting element LD. In an example, each of the alignment electrodes ELT1 to ELT3 may be formed as a multi-layer in which indium tin oxide (ITO)/silver (Ag)/indium tin oxide (ITO) are sequentially stacked each other.

Each of the alignment electrodes ELT1 to ELT3 may be used as an alignment line for receiving an alignment signal (or alignment voltage) to align the light emitting elements LD. In an example, the first and third alignment electrodes ELT1 and ELT3 may receive a first alignment signal (or first alignment voltage) transferred from some components of the pixel circuit layer PCL to be used as a first alignment line, and the second alignment electrode ELT2 may receive a second alignment signal (or second alignment voltage) transferred from other components of the pixel circuit layer PCL to be used as a second alignment line.

After the light emitting elements LD is aligned, the alignment electrodes ELT1 to ELT3 may be used as driving electrodes for driving the light emitting elements LD.

The second bridge pattern BRP2 and the alignment electrodes ELT1 to ELT3 may include a same material, and may be disposed in (or on) a same layer through a same process.

In some embodiments, the second bridge pattern BRP2 may be electrically connected to the first transistor T1 through a contact hole penetrating the interlayer insulating layer ILD (or protective layer PSV).

The first insulating layer INS may be provided and/or formed over the alignment electrodes ELT1 to ELT3 and the second bridge pattern BRP2. The first insulating layer INS1 may include an inorganic insulating layer made of an inorganic material or an organic insulating layer made of an organic material. The first insulating layer INS1 may be formed as an inorganic insulating layer advantageous in protecting the light emitting element LD from the pixel circuit layer PCL. In an example, the first insulating layer INS1 may include at least one of silicon nitride ($SiN_x$), silicon oxide ($SiO_x$), silicon oxynitride ($SiO_xN_y$), and metal oxide such as aluminum oxide ($AlO_x$), the disclosure is not limited thereto. In some embodiments, the first insulating layer INS1 may be formed as an organic insulating layer advantageous in planarizing a support surface of the light emitting element LD.

The light emitting element LD may be disposed on the first insulating layer INS1. The light emitting element LD may be aligned between the alignment electrodes ELT1 to ELT3.

The light emitting element LD may be a light emitting diode having a subminiature size, e.g., a size small to a degree of nanometer scale to micrometer scale, which is manufactured by using a material having an inorganic crystalline structure. For example, the light emitting element LD may include a first semiconductor layer, a second semiconductor layer, an active layer, and an insulative film. The first semiconductor layer may include a semiconductor layer of a type (e.g., a predetermined or selectable type), and the second semiconductor layer may include a semiconductor layer having a type different from the type of the first semiconductor layer. In an example, the first semiconductor layer may include an N-type semiconductor layer, and the second semiconductor layer may include a P-type semiconductor layer. The first semiconductor layer and the second semiconductor layer may include at least one semiconductor material among InAlGaN, GaN, AlGaN, InGaN, AlN, and InN. The active layer may be located between the first semiconductor layer and the second semiconductor layer, and have a single or multiple quantum well structure. In case that an electric field having a voltage (e.g., a predetermined or selectable voltage) or higher is applied to ends of the light emitting element LD, the light emitting element LD may emit light as electron-hole pairs are combined in the active layer.

The number of light emitting elements LD provided in the first sub-pixel SPX1_O may be at least two to a few tens. In some embodiments, the number of light emitting elements LD provided in the first sub-pixel SPX1_O may be variously changed.

The light emitting element LD may emit colored light and/or white light. In an embodiment, the light emitting element LD may emit blue light in a short wavelength band, but the disclosure is not limited thereto.

The second insulating layer INS2 (or second insulating pattern) may be provided and/or formed on the light emitting element LD. The second insulating layer INS2 may be provided and/or formed on the light emitting element LD to partially covert an outer circumferential surface (or surface) of the light emitting element LD. The active layer of the light emitting element LD may not contact an external conductive material by the second insulating layer INS2. The second insulating layer INS2 may allow end portions of the light emitting element LD to be exposed to the outside by covering only a portion of the outer circumferential surface (or surface) of the light emitting element LD.

The second insulating layer INS2 may be formed as a single layer or a multi-layer, and include an organic insulating layer including at least one inorganic material or an organic insulating layer including at least one organic material. The second insulating layer INS2 may be formed as an inorganic insulating layer including an inorganic material or an organic insulating layer including an organic material according to a design condition of the display device to which the light emitting element LD is applied, and the like. After the light emitting element LD is completely aligned, the second insulating layer INS2 is formed on the light emitting element LD, so that the light emitting element LD can be prevented from being separated at the position at which the light emitting element LD is aligned.

The first electrode CNE1 may be provided on the first alignment electrode ELT1. The first electrode CNE1 may be provided and/or formed on a first end portion EP1 of a first light emitting element LD1, and be connected to the first end portion EP1 of the first light emitting element LD1. The first electrode CNE1 may be provided on the second bridge pattern BRP2, and contact the second bridge pattern BRP2 through a contact hole penetrating the first insulating layer INS1. Accordingly, the second bridge pattern BRP2 and the first end portion EP1 of the first light emitting element LD1 may be electrically connected to each other through the first electrode CNE1.

In some embodiments, in case that an opening exposing the first alignment electrode ELT1 is formed in the first insulating layer INS1, the first electrode CNE1 may contact or connected to the first alignment electrode ELT1 through the opening. In some embodiments, in case that a capping layer (not shown) is disposed on the first alignment electrode ELT1, the first electrode CNE1 may be disposed on the capping layer to be connected to the first alignment electrode ELT1 through the capping layer. The above-described capping layer may protect the first alignment electrode ELT1 from a defect occurring in a manufacturing process of the display device, and further reinforce adhesion between the first alignment electrode ELT1 and the pixel circuit layer PCL located thereunder. The capping layer may include a transparent conductive material (or substance) such as indium zinc oxide (IZO).

The second electrode CNE2 may be provided on the second alignment electrode ELT2. The second electrode CNE2 may be provided and/or formed on a second end portion EP2 of a second light emitting element LD2, and be connected to the second end portion EP2 of the second light emitting element LD2. The second electrode CNE2 and the second end portion EP2 of the second light emitting element LD2 may be electrically connected to each other through the second electrode CNE2.

The intermediate electrode CTE may be provided on the second alignment electrode ELT2 and the third alignment electrode ELT3. The intermediate electrode CTE may be provided and/or formed on a second end portion EP2 of the first light emitting element LD1 and a first end portion EP1 of the second light emitting element LD2, and electrically connect the second end portion EP2 of the first light emitting element LD1 and the first end portion EP1 of the second light emitting element LD2 to each other.

In order to allow light emitted from the light emitting element LD and then reflected by the alignment electrodes ELT1 to ELT3 to advance in the image display direction of the display device without any loss, the first and second electrodes CNE1 and CNE2 and the intermediate electrode CTE may be formed of various transparent conductive materials. The first and second electrodes CNE1 and CNE2 and the intermediate electrode CTE may be configured substantially transparently or translucently to satisfy a transmittancy (or transmittance) (e.g., a predetermined or selectable transmittancy). For example, the first and second electrodes CNE1 and CNE2 and the intermediate electrode CTE may be configured substantially transparently to have a transmittance of about 80% or more, or a transmittance of about 90% or more.

However, the material of the first and second electrodes CNE1 and CNE2 and the intermediate electrode CTE is not limited to the above-described embodiment. In some embodiments, the first and second electrodes CNE1 and CNE2 and the intermediate electrode CTE may be formed of various opaque conductive materials (or substances). The first and second electrodes CNE1 and CNE2 and the intermediate electrode CTE may be formed as a single layer or a multi-layer.

The shape of the first and second electrodes CNE1 and CNE2 and the intermediate electrode CTE is not limited to a specific shape, and be variously changed within a range in which the first and second electrodes CNE1 and CNE2 and the intermediate electrode CTE are stably electrically connected to the light emitting element LD. The shape of the first and second electrodes CNE1 and CNE2 and the intermediate electrode CTE may be variously changed considering a connection relationship with electrodes disposed on the bottom of the first and second electrodes CNE1 and CNE2 and the intermediate electrode CTE.

The first and second electrodes CNE1 and CNE2 and the intermediate electrode CTE may be spaced apart from each other. In an example, the first and second electrodes CNE1 and CNE2 and the intermediate electrode CTE may be spaced apart from each other with the second insulating layer INS2 interposed therebetween. The first and second electrodes CNE1 and CNE2 and the intermediate electrode CTE may be formed in a same layer through a same process, but the disclosure is not limited thereto. For example, at least two of the first and second electrodes CNE1 and CNE2 and the intermediate electrode CTE may be provided in different layers and be formed through different processes.

In some embodiments, a third insulating layer (or over-coat layer) may be provided and/or formed on the first and second electrodes CNE1 and CNE2 and the intermediate electrode CTE. The third insulating layer may be an inorganic insulating layer including an inorganic material or an organic insulating layer including an organic material. In an example, the third insulating layer may have a structure in which at least one inorganic insulating layer and at least one organic insulating layer are alternately stacked each other. The third insulating layer may entirely cover the display element layer DPL, and block external moisture or humidity from being introduced into the display element layer DPL including the light emitting element LD. The third insulating layer may planarize a top surface of the display element layer DPL.

In some embodiments, the display element layer DPL may be configured to selectively further include an optical layer. In an example, the display element layer DPL may further include a color conversion layer including color conversion particles for converting light emitted from the light emitting elements LD into light of a specific color. The display element layer DPL may further include a color filter for allowing only light in a specific wavelength band to be transmitted therethrough. The color conversion layer will be described later with reference to FIGS. 9A and 9B.

FIGS. 8A and 8B are schematic views illustrating another embodiment of the first sub-pixel shown in FIG. 5. Similar to FIG. 6, FIGS. 8A and 8B schematically illustrate first sub-pixels SPX1_O_2 and SPX1_O_3 based on the light source part LSU (see FIG. 2C).

Referring to FIGS. 5, 6, 8A, and 8B, the first sub-pixels SPX1_O_2 and SPX1_O_3 shown in FIGS. 8A and 8B are substantially identical or similar to the first sub-pixel SPX1_O shown in FIG. 6, except a partial shape and an arrangement position of an electrode, and therefore, overlapping descriptions will not be repeated.

As shown in FIG. 8A, a first alignment electrode ELT1_1 may protrude toward the second bridge pattern BRP2, and the first alignment electrode ELT1_1 and the second bridge pattern BRP2 may be integrally formed (or may be integral with each other). A first electrode CNE1_1 may have a bar shape on a plane (or in a plan view), but the disclosure is not limited thereto. For example, the first sub-pixel SPX1_O_2 may include the first electrode CNE1 shown in FIG. 6.

Although a case where the first electrode CNE1 is connected to the second bridge pattern BRP2 located at a left side of the first sub-pixel SPX1_O (for example, the opposite direction of the first direction DR) has been described with reference to FIG. 6, the disclosure is not limited thereto.

For example, as shown in FIG. 8B, a first electrode CNE1_2 may overlap the third alignment electrode ELT3, and be connected to a second bridge pattern BRP2_2 located at a right side of the first sub-pixel SPX1_O_3 (for example, the first direction DR1).

An arrangement (and arrangement positions) of the first electrode CNE1_2, a second electrode CNE2_2, and an intermediate electrode CTE_2 may be opposite (or symmetrical) to an arrangement (and arrangement positions) of the first electrode CNE1, the second electrode CNE2, and the intermediate electrode CTE, which are shown in FIG. 6, in the first direction DR1.

As described above, the shapes and/or arrangement (and arrangement positions) of electrodes may be variously changed.

FIGS. 9A and 9B are schematic cross-sectional views illustrating the pixel included in the display device shown in FIG. 1. For convenience of description, FIGS. 9A and 9B illustrate individual components of the pixel circuit layer PCL and the display element layer DPL.

First, referring to FIG. 9A, light emitting elements LD disposed in sub-pixels SPX1 to SPX3 may emit light of a same color. For example, the sub-pixels SPX1 to SPX3 may include light emitting elements LD emitting light of a third color, e.g., blue light. A color conversion layer CCL and/or a color filter layer CFL may be provided in the sub-pixels SPX1 to SPX3, to display a full-color image. However, the disclosure is not limited thereto, and the sub-pixels SPX1 to SPX3 may include light emitting elements LD emitting rays of light of different colors.

The color conversion layer CCL and the display element layer DPL may be disposed in (or on) a same layer. For example, the color conversion layer CCL may be disposed between banks BNK.

The bank BNK may be located in a non-emission area NEA of the sub-pixels SPX1 to SPX3. The bank BNK may be formed between the sub-pixels SPX1 to SPX3 to surround each emission area EMA. Therefore, the bank BNK may define an emission area EMA of each of the sub-pixels SPX1 to SPX3. The bank BNK may serve as a dam structure which prevents a solution for forming a wavelength conversion pattern WCP and a light transmission pattern LTP in an emission area EMA from being introduced into an emission area EMA of an adjacent sub-pixel or controls a certain amount of solution to be supplied to each emission area EMA.

The bank BNK may include an organic material or an inorganic material. In some embodiments, the bank BNK may include a black matrix material (or light blocking material). The bank BNK may prevent light generated in a sub-pixel (e.g., a second sub-pixel SPX2) from advancing toward an adjacent sub-pixel (e.g., a first sub-pixel SPX1 or a third sub-pixel SPX3).

An opening exposing the display element layer DPL, corresponding to the emission area EMA, may be formed in the bank BNK.

The color conversion layer CCL may include a wavelength conversion pattern WCP (or color conversion particle), a light transmission pattern LTP, and a first capping layer CAP1. The wavelength conversion pattern WCP may include a first wavelength conversion pattern WCP1 and a second wavelength conversion pattern WCP2.

The first wavelength conversion pattern WCP1 may be disposed to overlap an emission area EMA of the first sub-pixel SPX1. For example, the first wavelength conversion pattern WCP1 may be provided in the opening of the bank BNK. The second wavelength conversion pattern WCP2 may be disposed to overlap an emission area EMA of the second sub-pixel SPX2. The light transmission pattern LTP may be disposed to overlap an emission area of the third sub-pixel SPX3.

In an embodiment, the first wave conversion pattern WCP1 may include first color conversion particles for converting light of the third color, which is emitted from a light emitting element LD, into light of a first color. In an example, in case that the light emitting element LD is a blue light emitting element emitting light of blue, and the first sub-pixel SPX1 is a red pixel, the first wavelength conversion pattern WCP1 may include a first quantum dot for converting light of blue, which is emitted from the blue light emitting element, into light of red.

For example, the first wavelength conversion pattern WCP1 may include first quantum dots dispersed in a matrix material such as base resin. The first quantum dot may absorb blue light and emit red light by shifting a wavelength of the blue light according to energy transition. In case that the first sub-pixel SPX1 is a pixel of another color, the first wavelength conversion pattern WCP1 may include a first quantum dot corresponding to the color of the first sub-pixel SPX1.

In an embodiment, the second wavelength conversion pattern WCP2 may include second color conversion particles for converting light of the third color, which is emitted from the light emitting element LD, into light of a second color. In an example, in case that the light emitting element LD is a blue light emitting element emitting light of blue, and the second sub-pixel SPX2 is a green pixel, the second wavelength conversion pattern WCP2 may include a second quantum dot for converting light of blue, which is emitted from the blue light emitting element, into light of green.

For example, the second wavelength conversion pattern WCP2 may include second quantum dots dispersed in a matrix material such as base resin. The second quantum dot may absorb blue light and emit green light by shifting a wavelength of the blue light according to energy transition.

The first quantum dot and the second quantum dot may have shapes such as a spherical shape, a pyramid shape, a multi-arm shape, a cubic nano particle, a nano tube, a nano wire, a nano fabric, or a nano plate particle. However, the disclosure is not limited thereto, and the shape of the first quantum dot and the second quantum dot may be variously changed.

In an embodiment, light of blue having a relatively short wavelength in a visible light band is incident into the first quantum dot and the second quantum dot, so that absorption coefficients of the first quantum dot and the second quantum dot can be increased. Accordingly, the efficiency of light finally emitted from the first sub-pixel SPX1 and the second sub-pixel SPX2 can be improved, and excellent color reproduction can be ensured. The pixel PXL may be configured by using light emitting elements LD of a same color (e.g., blue light emitting elements), so that the manufacturing efficiency of the display device can be improved.

In an embodiment, the light transmission pattern LTP may be provided to efficiently use light of the third color emitted from the light emitting element LD. In an example, in case that the light emitting element LD is a blue light emitting element emitting light of blue, and the third sub-pixel SPX3 is a blue pixel, the light transmission pattern LTP may include at least one kind of light scattering particles to efficiently use light emitted from the light emitting element LD.

For example, the light transmission pattern LTP may include light scattering particles dispersed in a matrix material such as base resin. In an example, the light transmission pattern LTP may include light scattering particles such as silica, but the material constituting the light scattering particles is not limited thereto.

The light scattering particles are not required to be disposed only in the emission area EMA of the third sub-pixel SPX3. In an example, the light scattering particles may be selectively included even at the inside of the first wavelength conversion pattern WCP1 and/or the second wavelength conversion pattern WCP2.

The first capping layer CAP1 may seal (or cover) the wave conversion pattern WCP and the light transmission pattern LTP. The first capping layer CAP1 may be disposed between the low refractive layer LRL and the display element layer DPL. The first capping layer CAP1 may be provided throughout the sub-pixels SPX1 to SPX3. The first capping layer CAP1 may prevent the color conversion layer CCL from being damaged or contaminated due to infiltration of an impurity such as moisture or air from the outside.

In an embodiment, the first capping layer CAP1 may be formed as a single layer or a multi-layer including at least one insulating material among silicon oxide (SiO$_x$), silicon nitride (SiN$_x$), silicon oxynitride (SiO$_x$N$_y$), aluminum oxide (AlO$_x$), and titanium oxide (TiO$_x$), but the disclosure is not limited thereto.

An optical layer OPL may include a low refractive layer LRL and a second capping layer CAP2. The optical layer OPL may be disposed on the color conversion layer CCL. The optical layer OPL may be disposed on the display element layer DPL.

The low refractive layer LRL may be disposed between the first capping layer CAP1 and the second capping layer CAP2. The low refractive layer LRL may be disposed between the color conversion layer CCL and the color filter layer CFL. The low refractive layer LRL may be provided throughout the sub-pixels SPX1 to SPX3.

The low refractive layer LRL may function to allow light provided from the color conversion layer CCL to be recycled by total reflection, thereby improving light efficiency. To this end, the low refractive layer LRL may have a refractive index relatively lower than that of the color conversion layer CCL.

In an embodiment, the low refractive layer LRL may include a base resin and hollow particles dispersed in the base resin. The hollow particle may include a hollow silica particle. As another example, the hollow particle may be a pore formed by porogen, but the disclosure is not limited thereto. The low refractive layer LRL may include at least one of zinc oxide (ZnO$_x$), a titanium dioxide (TiO$_x$) particle, and a nano silicate particle, but the disclosure is not limited thereto.

The second capping layer CAP2 may be disposed on the low refractive layer LRL. The second capping layer CAP2 may be disposed between the color filter layer CFL and the low refractive layer LRL. The second capping layer CAP2 may be provided throughout the sub-pixels SPX1 to SPX3. The second capping layer CAP2 may prevent the low refractive layer LRL from being damaged or contaminated due to infiltration of an impurity such as moisture or air from the outside. The second capping layer CAP2 and the first capping layer CAP1 may include a same material, or include one or more materials selected from the materials that may be used to form the first capping layer CAP1, e.g., as discussed herein.

In accordance with an embodiment, the second capping layer CAP2 may be formed as a single layer or a multi-layer including at least one insulating material among silicon oxide (SiO$_x$), silicon nitride (SiN$_x$), silicon oxynitride (SiO$_x$N$_y$), aluminum oxide (AlO$_x$), and titanium oxide (TiO$_x$), but the disclosure is not limited thereto.

The color filter layer CFL may be disposed on the second capping layer CAP2. The color filter layer CFL may be provided throughout the sub-pixels SPX1 to SPX3. The color filter layer CFL may include color filters CF1, CF2, and CF3 and a planarization layer PLA.

In an embodiment, the color filters CF1, CF2, and CF3 may be disposed on the second capping layer CAP2. In a plan view, the color filters CF1, CF2, and CF3 may overlap the emission areas EMA of the sub-pixels SPX1 to SPX3.

In an embodiment, a first color filter CF1 allows light of the first color to be transmitted therethrough, and may allow light of the second color and light of the third color not to be transmitted therethrough. For example, the first color filter CF1 may include a colorant of the first color.

In an embodiment, a second color filter CF2 allows light of the second color to be transmitted therethrough, and may allow light of the first color and light of the third color not to be transmitted therethrough. For example, the second color filter CF2 may include a colorant of the second color.

In an embodiment, a third color filter CF3 allows light of the third color to be transmitted therethrough, and may allow light of the first color and light of the second color not to be transmitted therethrough. For example, the third color filter CF3 may include a colorant of the third color.

In an embodiment, the planarization layer PLA may be provided over the color filters CF1 to CF3. The planarization layer PLA may cover the color filters CF1 to CF3. The planarization layer PLA may cancel a step difference occurring due to the color filters CF1 to CF3. The planarization layer PLA may be provided throughout the sub-pixels SPX1 to SPX3.

In accordance with an embodiment, the planarization layer PLA may include an organic material such as acryl resin, epoxy resin, phenolic resin, polyamides resin, polyimides resin, polyesters resin (e.g., unsaturated polyesters resin), poly-phenylene ethers resin, poly-phenylene sulfides resin, or benzocyclobutene (BCB). However, the disclosure is not limited thereto, and the planarization layer PLA may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

An overcoat layer OC may be disposed on the planarization layer PLA. The overcoat layer OC may be disposed between an upper film layer UFL and the color filter layer CFL. The overcoat layer OC may be provided throughout the sub-pixels SPX1 to SPX3. The overcoat layer OC may cover a lower member including the color filter layer CFL. The overcoat layer OC may prevent moisture or air from infiltrating into the above-described lower member. The overcoat layer OC may protect the above-described lower member from a foreign matter such as dust.

The overcoat layer OC may include an organic material or an inorganic material. For example, the overcoat layer OC may include one or more materials selected from the materials that may be used to form the planarization layer PLA, e.g., as discussed herein.

The upper film layer UFL may be disposed on the color filter layer CFL. The upper film layer UFL may be disposed at an outer portion of the display device to reduce external influence on the display device. The upper film layer UFL may be provided throughout the sub-pixels SPX1 to SPX3.

In an embodiment, the upper film layer UFL may include an anti-reflective (AR) coating. The AR coating may mean a component formed by coating a material having an anti-reflection function on a surface of a specific component. The coated material may have a low reflexibility. In an example, the material used for the AR coating may include at least one of silicon oxide ($SiO_x$), aluminum oxide ($AlO_x$), and titanium oxide ($TiO_x$). However, the disclosure is not limited thereto, and various materials may be applied.

Although a case where the color conversion layer CCL and the display element layer DPL are disposed in a same layer has been described with reference to FIG. 9A, the disclosure is not limited thereto.

Referring to FIG. 9B, the color conversion layer CCL may be disposed on the display element layer DPL. For example, the first capping layer CAP1 may seal (or cover) an area in which the light emitting elements LD are disposed, and the color conversion layer CCL may be disposed on the first capping layer CAP1.

In an embodiment, the color conversion layer CCL may further include a light blocking layer LBL (or light blocking pattern). The light blocking layer LBL may be disposed on the display element layer DPL. The light blocking layer LBL may be disposed between the first capping layer CAP1 and the second capping layer CAP2. The light blocking layer LBL may be disposed to surround the first wavelength conversion pattern WCP1, the second wavelength conversion pattern WCP2, and the light transmission pattern LTP at a boundary of the sub-pixels SPX1 to SPX3.

The light blocking layer LBL may define emission areas EMA and non-emission areas NEA. In an example, the light blocking layer LBL may not overlap the emission area EMA in a plan view. The light blocking layer LBL may overlap the non-emission area NEA in a plan view. In an example, areas in which the light blocking layer LBL is not disposed may be defined as the emission areas EMA of the sub-pixels SPX1 to SPX3.

In an embodiment, the light blocking layer LBL may be formed of an organic material including at least one of graphite, carbon black, black pigment, and black dye, or be formed of a metal material including chromium (Cr). However, the material is not limited insofar as it can block light transmission and absorb light.

The second capping layer CAP2 may seal (or cover) the first wavelength conversion pattern WCP1, the second wavelength conversion pattern WCP2, and the light transmission pattern LTP.

The low refractive layer LRL may be disposed between the second capping layer CAP2 and a third capping layer CAP3. The third capping layer CAP3 and the first capping layer CAP1 may include a same material, or include one or more materials that may be used to form the first capping layer CPA1, e.g., as discussed herein.

FIG. 10 is a schematic cross-sectional view illustrating another embodiment of the sub-pixel included in the display device shown in FIG. 1.

Referring to FIGS. 1, 7, and 10, a sub-pixel SPX_1 may include a pixel circuit layer PCL and a display element layer DPL_1, which are disposed on a substrate SUB. The substrate SUB and the pixel circuit layer PCL have been described with reference to FIG. 7, and therefore, overlapping descriptions will not be repeated.

The display element layer DPL_1 may include a pixel defining layer PDL and a light emitting element LD_1. The light emitting element LD_1 may include a first pixel electrode AE, an emitting layer EML, and a second pixel electrode CE (or common electrode). For example, the light emitting element LD_1 may be an organic light emitting diode.

The first pixel electrode AE may be disposed on a protective layer PSV. The first pixel electrode AE may be electrically connected to a first transistor T1 through a contact hole penetrating an interlayer insulating layer ILD (or the protective layer PSV).

The pixel defining layer PDL may include an opening, and at least a portion of the first pixel electrode AE may be exposed by the opening. In some embodiments, the pixel defining layer PDL may be omitted. The pixel defining layer PDL may include an organic material.

The emitting layer EML may be disposed on the first pixel electrode AE, and the second pixel electrode CE may be disposed on the emitting layer EML.

One of the first pixel electrode AE and the second pixel electrode CE may be an anode electrode, and the other of the first pixel electrode AE and the second pixel electrode CE may be a cathode electrode. For example, the first pixel electrode AE may be the anode electrode, and the second pixel electrode CE may be the cathode electrode.

At least one of the first pixel electrode AE and the second pixel electrode CE may be a transmissive electrode. For example, in case that the display device is a top emission display device, the first pixel electrode AE may be a reflective electrode, and the second pixel electrode CE may be a transmissive electrode.

The emitting layer EML may be disposed on an exposed surface of the first pixel electrode AE. The emitting layer EML may have a multi-layer thin film structure including at least a light generation layer. The emitting layer EML may include a hole injection layer for injecting holes, a hole transport layer for increasing a hole-electron recombination opportunity by suppressing movement of electrons which are excellent in transportability of holes and are not combined in a light generation layer, the light generation layer for emitting light by recombination of the injected electrons and holes, a hole blocking layer for suppressing the movement of the holes that are not combined in the light generation layer, an electron transport layer for smoothly transporting the electrons to the light generation layer, and an electron injection layer for injecting the electrons.

The hole injection layer, the hole transport layer, the hole blocking layer, the electron transport layer, and the electron injection layer may be a common layer in which the hole injection layer, the hole transport layer, the hole blocking layer, the electron transport layer, and the electron injection layer are connected to each other in adjacent sub-pixels.

The second pixel electrode CE may be disposed on the emitting layer EML. The second pixel electrode CE may be a semi-transmissive reflective layer. For example, the second pixel electrode CE may be a thin metal layer having a thickness to a degree to which the second pixel electrode CE enables light to be transmitted therethrough. The second pixel electrode CE may allow a portion of light generated in the light generation layer to be transmitted therethrough, and reflect the other of the light generated in the light generation layer.

A portion of light emitted from the emitting layer EML is not transmitted through the second pixel electrode CE, and light reflected from the second pixel electrode CE may be again reflected from the first pixel electrode AE. For example, light emitted from the emitting layer EML may resonate between the first pixel electrode AE and the second pixel electrode CE. The light emission efficiency of the light emitting element LD_1 can be improved by the resonance of the light.

The display element layer DPL_1 may further include a thin film encapsulation layer TFE.

The thin film encapsulation layer TFE may be disposed on the second pixel electrode CE. The thin film encapsulation layer TFE may be commonly disposed in sub-pixels. The thin film encapsulation layer TFE may directly cover the second pixel electrode CE.

The thin film encapsulation layer TFE may include a first encapsulation inorganic layer IOL1, a first encapsulation organic layer OL, and a second encapsulation inorganic layer IOL2, which are sequentially stacked each other on the second pixel electrode CE. The encapsulation inorganic layer may be made of an inorganic insulating material such as polysiloxane, silicon nitride, silicon oxide, and silicon oxynitride. The encapsulation organic layer may be made of an organic insulating material such as a polyacryl-based compound, a polyimide-based compound, a fluorine-based carbon compound such as Teflon, or a benzocyclobutene-based compound.

FIG. 11 is a schematic diagram of an equivalent circuit illustrating a comparative embodiment of the sub-pixels included in the display device shown in FIG. 1. FIG. 12 is a schematic layout view illustrating the sub-pixels shown in FIG. 11. FIGS. 11 and 12 will be mainly described based on portions different from those of the above-described embodiment (e.g., FIGS. 3 and 4), and repetitive descriptions with respect to those of the above-described embodiment will be omitted.

Referring to FIGS. 3, 4, 11, and 12, a first pixel PXL_ODD_C and a second pixel PXL_EVEN_C may be located on a horizontal line.

The first pixel PXL_ODD_C may include first, second, and third sub-pixels SPX1_O_C, SPX2_O_C, and SPX3_O_C, and the second pixel PXL_EVEN_C may include first, second and third sub-pixels SPX1_E_C, SPX2_E_C, and SPX3_E_C.

As shown in FIG. 12, the first, second, and third sub-pixels SPX1_O_C, SPX2_O_C, and SPX3_O_C of the first pixel PXL_ODD_C may have a same pixel structure, and the first, second, and third sub-pixels SPX1_E_C, SPX2_E_C, and SPX3_E_C of the second pixel PXL_EVEN_C may have a same pixel structure. The first pixel PXL_ODD_C and the second pixel PXL_EVEN_C may have pixel structures reversed to each other in the second direction DR2.

A first gate line SC_ODD and a second gate line SC_EVEN may extend (roughly) in the first direction DR1, and be arranged in the second direction DR2. As shown in FIG. 12, the first gate line SC_ODD and the second gate line SC_EVEN may have a partially bent shape between the first pixel PXL_ODD_C and the second pixel PXL_EVEN_C, but the disclosure is not limited thereto.

The first, second, and third sub-pixels SPX1_O_C, SPX2_O_C, and SPX3_O_C may be electrically connected to the first gate line SC_ODD, and the first, second, and third sub-pixels SPX1_E_C, SPX2_E_C, and SPX3_E_C may be electrically connected to the second gate line SC_EVEN.

Data lines D1 to D6 may extend in the second direction DR2 and be arranged in the first direction DR1. A distance between the data lines D1 to D6 may be substantially equal to a distance between the sub-pixels SPX1_O_C to SPX3_O_C and SPX1_E_C to SPX3_E_C. For example, the data lines D1 to D6 may be spaced apart from each other with one of the sub-pixels SPX1_O_C to SPX3_O_C and SPX1_E_C to SPX3_E_C, which is interposed therebetween.

Similar to the data lines D1 to D6, sensing lines SL1 to SL6 may extend in the second direction DR2 and be arranged in the first direction DR1. A distance between the sensing lines SL1 to SL6 may be substantially equal to the distance between the data lines D1 to D6.

The data lines D1 to D6 and the sensing lines SL1 to SL6 may be disposed while forming pairs. One of the data lines D1 to D6 and one of the sensing lines SL1 to SL6 may be disposed between adjacent two sub-pixels among the sub-pixels SPX1_O_C to SPX3_O_C and SPX1_E_C to SPX3_E_C while forming a pair.

Each of the sub-pixels SPX1_O_C to SPX3_O_C and SPX1_E_C to SPX3_E_C may be connected to a data line most adjacent thereto in a specific direction among the data lines D1 to D6, and be connected to a sensing line most adjacent thereto in a specific direction among the sensing lines SL1 to SL6. In the first pixel PXL_ODD_C, the first sub-pixel SPX1_O_C may be electrically connected to a first sensing line SL1 and a first data line D1, the second sub-pixel SPX2_O_C may be electrically connected to a second sensing line SL2 and a second data line D2, and the third sub-pixel SPX3_O_C may be electrically connected to a third sensing line SL3 and a third data line D3. In the second pixel PXL_EVEN_C, the first sub-pixel SPX1_E_C may be connected to a fourth sensing line SL4 and a fourth data line D4, the second sub-pixel SPX2_E_C may be connected to a fifth sensing line SL5 and a fifth data line D5, and the third sub-pixel SPX3_E_C may be connected to a sixth sensing line SL6 and a sixth data line D6.

The sensing lines SL1 to SL6 may be electrically connected to each other, but the disclosure is not limited thereto.

Data lines corresponding to sub-pixels emitting light of a same color among the sub-pixels SPX1_O_C to SPX3_O_C and SPX1_E_C to SPX3_E_C may be electrically connected to each other. For example, the first data line D1 may be electrically connected to the fourth data line D4 through a bridge line BRL (see FIG. 12). The bridge line BRL may be located in the non-display area NDA (see FIG. 1). Similarly, the second line D2 may be connected to the fifth data line D5, and the third data line D3 may be connected to the sixth data line D6.

Two sub-pixels emitting light of a same color share a data line, so that the number of channels of a driver which provides a signal to the data lines D1 to D6 can be decreased. However, as compared with FIGS. 3 and 4, a number of the data lines D1 to D6 (and the sensing lines SL1 to SL6) is relatively large, and therefore, a load of the data lines D1 to D6 (and the sensing lines SL1 to SL6) may be large with reference to a data driver which provides a signal to the data lines D1 to D6. For example, a parasitic capacitance formed in the first and fourth data lines D1 and D4 (and the bridge line BRL) may be greater than a parasitic capacitor formed in the second data line D2 (for example, the second data line D2 shown in FIG. 4). Therefore, a charging time in accordance with the embodiment shown in FIGS. 11 and 12 may be longer than a charging time in accordance with the embodiment shown in FIGS. 3 and 4. In other words, in the embodiment shown in FIGS. 3 and 4, a load of the data lines D1 to D6 (and the sensing lines SL1 to SL6) is reduced, so that the charging time can be more sufficiently secured.

FIG. 13 is a schematic diagram of an equivalent circuit illustrating another embodiment of the sub-pixels included in the display device shown in FIG. 1. FIG. 14 is a schematic layout view illustrating the sub-pixels shown in FIG. 13. FIGS. 13 and 14 will be mainly described based on portions different from those of the above-described embodiment (e.g., FIGS. 3 to 5), and repetitive descriptions with respect to those of the above-described embodiment will be omitted.

Referring to FIGS. 3, 4, 13, and 14, a first pixel PXL_ODD_1 and a second pixel PXL_EVEN_1 may be located on a horizontal line.

The first pixel PXL_ODD_1 may include first, second, and third sub-pixels SPX1_O_1, SPX2_O_1, and SPX3_O_1, and the second pixel PXL_EVEN_1 may include first, second, and third sub-pixels SPX1_E_1, SPX2_E_1, and SPX3_E_1.

In embodiments, two adjacent sub-pixels among the sub-pixels SPX1_O_1 to SPX3_O_1 and SPX1_E_1 to SPX3_E_1 may share a data line.

For example, the second sub-pixel SPX2_O_1 and the third sub-pixel SPX3_O_1 of the first pixel PXL_ODD_1 may be electrically connected to a second data line D2. The first sub-pixel SPX1_E_1 and the second sub-pixel SPX2_E_1 of the second pixel PXL_EVEN_1 may be electrically connected to a fourth data line D4. The third sub-pixel SPX3_E_1 of the second pixel PXL_EVEN_1 may be electrically connected to a sixth data line D6. The second sub-pixel SPX2_O_1 of the first pixel PXL_ODD_1 may be electrically connected to a reference data line D0. The first sub-pixel SPX1_O_1 of the first pixel PXL_ODD_1 may not share any data line with another sub-pixel, but the disclosure is not limited thereto. For example, a dummy sub-pixel connected to the reference data line D0 may be provided at a left side of the first pixel PXL_ODD_1.

Referring to FIGS. 4, 5, and 14, components shown in FIG. 14 are substantially identical or similar to those shown in FIGS. 4 and 5, except second semiconductor patterns ACT2_2 and ACT2_3 and third semiconductor patterns ACT3_2 and ACT3_3, and therefore, overlapping descriptions will not be repeated.

In the first sub-pixel SPX1_O_1 of the first pixel PXL_ODD_1, a second semiconductor pattern ACT2_2 is located in an upper direction of a second capacitor electrode CE2, and may partially overlap a first gate line SC_ODD. A second part of the second semiconductor pattern ACT2_2 may be electrically connected to the second capacitor electrode CE2 through a bridge pattern (e.g., the fourth bridge pattern BRP4 and the contact hole, which are shown in FIG. 5). A first part of the second semiconductor pattern ACT2_2 may extend to the reference data D0 (see FIG. 13) in the opposite direction of the first direction DR1, and be electrically connected to the reference data line D0 through a bridge pattern (and a contact hole).

A third semiconductor pattern ACT3_2 is located in the upper direction of a first capacitor electrode CE1, and may partially overlap the first gate line SC_ODD. A second part of the third semiconductor pattern ACT3_2 may be electrically connected to the first capacitor electrode CE1 through a bridge pattern (e.g., the sixth bridge pattern BRP6 and the contact hole, which are shown in FIG. 5). A first part of the third semiconductor pattern ACT3_2 may be electrically connected to a first sensing line SL1.

As compared with the embodiment shown in FIGS. 4 and 5, in the embodiment shown in FIG. 14, the connection patterns CNP1 to CNP3 (see FIG. 4) are not included, so that the circuit structure can be further simplified.

FIG. 15 is a schematic view illustrating a light emitting element in accordance with an embodiment of the disclosure. Although FIG. 15 illustrates a pillar-shaped light emitting element LD, the kind and/or shape of the light emitting element LD is not limited thereto.

Referring to FIG. 15, the light emitting element LD may include a first semiconductor layer 11, a second semiconductor layer 13, and an active layer 12 interposed between the first and second semiconductor layers 11 and 13. In an example, in case that an extending direction of the light emitting element LD is a length (L) direction, the light emitting element LD may include the first semiconductor layer 11, the active layer 12, and the second semiconductor layer 13, which are sequentially stacked each other in the length (L) direction.

The light emitting element LD may be provided in a pillar shape extending in a direction. The light emitting element LD may have a first end portion EP1 and a second end portion EP2. One of the first and second semiconductor layers 11 and 13 may be disposed at the first end portion EP1 of the light emitting element LD. The other of the first and second semiconductor layers 11 and 13 may be disposed at the second end portion EP2 of the light emitting element LD.

In some embodiments, the light emitting element LD may be a light emitting element manufactured in a pillar shape through an etching process, or the like. In this specification, the term "pillar shape" may include a rod-like shape or bar-like shape, which is long in the length (L) direction (for example, its aspect ratio is greater than about 1), such as a cylinder or a polyprism, and the shape of its section is not particularly limited. For example, a length L of the light emitting element LD may be greater than a diameter D (or a width of a cross-section) of the light emitting element LD.

The light emitting element LD may have a size small to a degree of nanometer scale to micrometer scale. In an example, the light emitting element LD may have a diameter D (or width) in a range of nanometer scale to micrometer scale and/or a length L in a range of nanometer scale to micrometer scale. However, the size of the light emitting element LD is not limited thereto, and the size of the light emitting element LD may be variously changed according to design conditions of various types of devices, e.g., a display device, and the like, which use, as a light source, a light emitting device using the light emitting element LD.

The first semiconductor layer 11 may be a first conductivity type semiconductor layer. For example, the first semiconductor layer 11 may include an n-type semiconductor layer. In an example, the first semiconductor layer 11 may include at least one semiconductor material among InAl-GaN, GaN, AlGaN, InGaN, AlN, and InN, and include an n-type semiconductor layer doped with a first conductivity type dopant such as Si, Ge, or Sn. However, the material constituting the first semiconductor layer 11 is not limited thereto. The first semiconductor layer 11 may be formed of various materials.

The active layer 12 is formed on the first semiconductor layer 11, and may be formed in a single quantum well structure or a multiple quantum well structure. The position of the active layer 12 may be variously changed according to a kind of the light emitting element LD.

A clad layer (not shown) doped with a conductive dopant may be formed on the top and/or the bottom of the active layer 12. In an example, the clad layer may be formed as an AlGaN layer or InAlGaN layer. In some embodiments, a material such as AlGaN or AlInGaN may be used to form the active layer 12. The active layer 12 may be formed of various materials.

The second semiconductor layer 13 is formed on the active layer 12, and may include a semiconductor layer having a type different from that of the first semiconductor layer 11. For example, the second semiconductor layer 13 may include a p-type semiconductor layer. In an example, the second semiconductor layer 13 may include at least one semiconductor material among InAlGaN, GaN, AlGaN, InGaN, AlN, and InN, and include a p-type semiconductor layer doped with a second conductivity type dopant such as Mg. However, the material constituting the second semiconductor layer 13 is not limited thereto. The second semiconductor layer 13 may be formed of various materials.

In case that a voltage which is a threshold voltage or more is applied to ends of the light emitting element LD, the light emitting element LD emits light as electron-hole pairs are combined in the active layer 12. The light emission of the light emitting element LD is controlled by using such a principle, so that the light emitting element LD can be used as a light source for various light emitting devices, including a pixel of a display device.

The light emitting element LD may further include an insulative film INF provided on a surface thereof. The insulative film INF may be formed on the surface of the light emitting element LD to surround an outer circumferential surface of at least the active layer 12. The insulative film INF may further surround an area of each of the first and second semiconductor layers 11 and 13.

In some embodiments, the insulative film INF may expose the end portions of the light emitting element LD, which have different polarities. For example, the insulative film INF may expose an end of each of the first and second semiconductor layers 11 and 13 located at the first and second end portions EP1 and EP2 of the light emitting element LD. In another embodiment, the insulative film INF may expose a side portion of each of the first and second semiconductor layers 11 and 13 adjacent to the first and second end portions EP1 and EP2 of the light emitting element LD, which have different polarities.

In accordance with an embodiment, the insulative film INF may be formed as a single layer or a multi-layer (e.g., a double layer formed of aluminum oxide ($AlO_x$) and silicon oxide ($SiO_x$)), including at least one insulating material among silicon oxide ($SiO_x$), silicon nitride ($SiN_x$), silicon oxynitride ($SiO_xN_y$), aluminum oxide ($AlO_x$), and titanium oxide ($TiO_x$), but the disclosure is not limited thereto. For example, in accordance with another embodiment, the insulative film INF may be omitted.

In case that the insulative film INF is provided to cover the surface of the light emitting element LD, particularly, the outer circumferential surface of the active layer 12, the active layer 12 can be prevented from being short-circuited with a first pixel electrode, a second pixel electrode, or the like, which will be described later. Accordingly, the electrical stability of the light emitting element LD can be ensured.

In case that the insulative film INF is provided on the surface of the light emitting element LD, a surface defect of the light emitting element LD is minimized, thereby improving the lifespan and efficiency of the light emitting element LD. In addition, even in case that light emitting elements LD are densely disposed, an unwanted short circuit can be prevented from occurring between the light emitting elements LD.

In an embodiment, the light emitting element LD may further include an additional component in addition to the first semiconductor layer 11, the active layer 12, the second semiconductor layer 13, and/or the insulative film INF surrounding the same. For example, the light emitting element LD may additionally include at least one phosphor layer, at least one active layer, at least one semiconductor layer, and/or at least one electrode layer, which are disposed at ends (or first ends) of the first semiconductor layer 11, the active layer 12, and/or the second semiconductor layer 13. In an example, a contact electrode layer may be disposed at each of the first and second end portions EP1 and EP2 of the light emitting element LD. Although FIG. 15 illustrates, as an example, the pillar-shaped light emitting element LD, the kind, structure, and/or shape of the light emitting element LD may be variously changed. For example, the light emitting element LD may be formed in a core-shell structure having a polypyramid shape.

A light emitting device including the above-described light emitting element LD may be used in various kinds of devices which require a light source, including a display device. For example, light emitting elements LD may be disposed in each pixel of a display panel, and be used as a light source of each pixel. However, the application field of the light emitting element LD is not limited to the above-described example. For example, the light emitting element LD may be used in other types of devices that require a light source, such as a lighting device.

In the display device in accordance with the disclosure, two sub-pixels may share a data line. In case that the two sub-pixels share a data line, a number of data lines and the entire load according thereto can be decreased, as compared with when two sub-pixels are connected to two data lines.

In addition, two sub-pixels emitting light of a same color may share a data line. Thus, a fluctuation range (and a transition time) of a data signal provided to the data line can be relatively reduced, and a charging time for which a data signal is recorded in a sub-pixel can be more sufficiently secured.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
data lines arranged in a first direction, the data lines extending in a second direction and comprising even data lines; and
a plurality of pixels, each pixel of the plurality of pixels comprising sub-pixels arranged in the first direction, the sub-pixels being electrically connected to the data lines, wherein
a distance between closest even data lines of the even data lines is greater than a distance between adjacent sub-pixels of the sub-pixels,
each pixel of the plurality of pixels comprises:
first sub-pixels emitting light of a first color; and
second sub-pixels emitting light of a second color, and
two first sub-pixels of two pixels adjacent to each other in the first direction are electrically connected to one even data line among the even data lines.

2. The display device of claim 1, wherein two second sub-pixels of the two pixels adjacent to each other in the first direction are electrically connected to another even data line among the even data lines.

3. The display device of claim 1, wherein
two closest even data lines of the even data lines are spaced apart from each other, and two sub-pixels are disposed between the two closest even data lines in one row of sub-pixels.

4. The display device of claim 1, wherein
each pixel of the plurality of pixels further includes third sub-pixels emitting light of a third color, and
the one even data line electrically connected to the two first sub-pixels is located between a second sub-pixel among the second sub-pixels and a third sub-pixel among the third sub-pixels which are adjacent to each other.

5. The display device of claim 4, wherein
two third sub-pixels of the two adjacent pixels are electrically connected to another even data line among the even data lines, and
the another even data line is located between a first sub-pixel among the first sub-pixels and a second sub-pixel among the second sub-pixels, the first sub-pixel and the second sub-pixel belonging to one pixel of the plurality of pixels.

6. The display device of claim 1, further comprising:
sensing lines arranged in the first direction, the sensing lines extending in the second direction and comprising odd sensing lines,
wherein pairs of two adjacent sub-pixels among the sub-pixels arranged in the first direction are electrically connected to one corresponding sensing line among the sensing lines.

7. The display device of claim 6, wherein a distance between closest odd sensing lines of the odd sensing lines is substantially equal to the distance between the closest even data lines.

8. The display device of claim 6, wherein the even data lines and the odd sensing lines are alternately arranged in the first direction with one sub-pixel of one row being disposed between a pair of an even data line and an odd sensing line adjacent to each other.

9. The display device of claim 6, wherein the two first sub-pixels are electrically connected to different odd sensing lines among the odd sensing lines.

10. The display device of claim 6, wherein
each odd sensing line of the odd sensing lines is electrically connected to two sub-pixels of one row adjacent to two opposite sides of the each odd sensing line, and
the two sub-pixels emit lights of different colors.

11. The display device of claim 1, wherein
each of the sub-pixels includes:
a pixel circuit including at least one transistor; and
at least one light emitting element electrically connected to the pixel circuit, and
the two first sub-pixels have circuit structures reversed to each other in the second direction in a plan view.

12. The display device of claim 11, wherein the at least one light emitting element includes inorganic light emitting diodes electrically connected in parallel to each other.

13. The display device of claim 11, wherein the at least one light emitting element includes an organic light emitting diode.

14. The display device of claim 1, wherein each of the sub-pixels includes:
at least one light emitting element disposed on a substrate;
a wavelength conversion pattern disposed above the at least one light emitting element, the wavelength conversion pattern emitting light by converting a wavelength band of light incident from the at least one light emitting element; and
a color filter disposed above the wavelength conversion pattern.

15. A display device comprising:
a first data line, a second data line, and a third data line arranged in a first direction and extending in a second direction;
a first scan line and a second scan line extending in the first direction; and
a first pixel and a second pixel electrically connected to the first and second scan lines and adjacent to each other in one pixel row, wherein
each of the first pixel and the second pixel includes a first sub-pixel, a second sub-pixel, and a third sub-pixel which are sequentially arranged in the first direction,
the first sub-pixel of the first pixel and the first sub-pixel of the second pixel share the first data line, and
the third sub-pixel of the first pixel and the third sub-pixel of the second pixel share the second data line.

16. The display device of claim 15, wherein
the second sub-pixel of the second pixel is electrically connected to the third data line, and the second sub-pixel of the first pixel is electrically connected to a reference data line different from the third data line.

17. The display device of claim 16, wherein the first data line is located between the second sub-pixel and the third sub-pixel of the first pixel, and the second data line is located between the first sub-pixel and the second sub-pixel of the second pixel.

18. The display device of claim 16, further comprising:

sensing lines arranged in the first direction, the sensing lines extending in the second direction, wherein each of the sensing lines is electrically connected to two sub-pixels most adjacent thereto among the first, second, and third sub-pixels.

19. The display device of claim 18, wherein the sensing lines include a first sensing line, a second sensing line, and a third sensing line, the first sub-pixel and the second sub-pixel of the first pixel share the first sensing line, and the third sub-pixel of the first pixel and the first sub-pixel of the second pixel share the second sensing line.

20. The display device of claim 15, wherein each of the first, second, and third sub-pixels includes:

a pixel circuit including at least one transistor; and at least one light emitting element electrically connected to the pixel circuit, and the at least one light emitting element includes inorganic light emitting diodes electrically connected in parallel to each other.

\* \* \* \* \*